(12) United States Patent
Chien et al.

(10) Patent No.: US 8,367,477 B2
(45) Date of Patent: Feb. 5, 2013

(54) ELECTRONIC DEVICE PACKAGE AND METHOD FOR FORMING THE SAME

(76) Inventors: Wen-Cheng Chien, Hsinchu (TW); Ching-Yu Ni, Hsinchu (TW); Shu-Ming Chang, Tucheng (TW)

( * ) Notice: Subject to any disclaimer, the term of this patent is extended or adjusted under 35 U.S.C. 154(b) by 464 days.

(21) Appl. No.: 12/722,486

(22) Filed: Mar. 11, 2010

(65) Prior Publication Data
US 2010/0230803 A1    Sep. 16, 2010

Related U.S. Application Data

(60) Provisional application No. 61/160,146, filed on Mar. 13, 2009.

(51) Int. Cl.
*H01L 23/48* (2006.01)
(52) U.S. Cl. ............... 438/121; 438/124; 257/E21.509
(58) Field of Classification Search ............. 257/693, 257/690, E23.023, E21.509, E23.011; 438/121, 438/124, 126
See application file for complete search history.

(56) References Cited

U.S. PATENT DOCUMENTS
2009/0039527 A1   2/2009  Chan et al.

FOREIGN PATENT DOCUMENTS
CN   101093869   12/2007
CN   101355142   1/2009

*Primary Examiner* — Roy Potter
(74) *Attorney, Agent, or Firm* — Liu & Liu

(57) ABSTRACT

An embodiment of the invention provides a method for forming an electronic device package, which includes providing a carrier substrate having an upper surface and an opposite lower surface; forming a cavity from the upper surface of the carrier substrate; disposing an electronic device having a conducting electrode in the cavity; forming a filling layer in the cavity, wherein the filling layer surround the electronic device; thinning the carrier substrate from the lower surface to a predetermined thickness; forming at least a through-hole in the electronic device or the in the carrier substrate; and forming a conducting layer over a sidewall of the through-hole, wherein the conducting layer electrically connects to the conducting electrode.

8 Claims, 29 Drawing Sheets

ELECTRONIC DEVICE PACKAGE AND METHOD FOR FORMING THE SAME

CROSS REFERENCE TO RELATED APPLICATIONS

This Application claims the benefit of U.S. Provisional Application No. 61/160,146, filed on Mar. 13, 2009, the entirety of which is incorporated by reference herein.

BACKGROUND OF THE INVENTION

1. Field of the Invention

The present invention relates to an electronic device package and manufacturing method thereof, and in particular relates to an electronic device package having an upper package layer directly cured from a liquid state material and/or having a through substrate via (TSV).

2. Description of the Related Art

Photoelectric devices such as light detecting devices or light emitting devices are important elements in the application of capturing images or lighting. Thus, photoelectric devices have been widely applied in commercial electronic and portable electronic products, such as a digital cameras, digital video recorders, mobile phones, solar cells, displays, lighting apparatuses, and so on. With miniaturization of electronic products, the size of the electronic device package structure of photoelectric devices is accordingly decreasing.

For conventional electronic device packaging, a package structure for an electronic device, not only provides a connecting interface for electronic devices and electronic elements, but also provides electronic devices with protection from environmental contaminants, among other functions. For photoelectric devices, such as a CMOS image detecting devices or light emitting diode devices, an electronic device package having at least a transparent substrate, such as a glass substrate, serving as an upper package layer to receive light for or transmit light to the photoelectric device, must be provided to encapsulate and package the photoelectric device. Conventionally, for forming the electronic device package, an adhesive is applied on the entire upper surface of the transparent substrate, and then the transparent substrate is bonded on a wafer having light detecting devices or light emitting devices. However, the adhesive between the transparent substrate and the photoelectric device may cause refraction of light, thus influencing the input and/or output of light thereto and/or therefrom.

To prevent the input and/or output of light thereto and/or therefrom from being influenced by the adhesive, a method using a dam structure supporting the transparent substrate on the wafer and forming a plurality of cavities between the wafer and the transparent substrate has been developed. In the method, instead of applying the adhesive to the entire upper surface of the transparent substrate for bonding on the photoelectric devices, the adhesive is only applied on the dam structure. Light input to or output from the photoelectric device only travels through the cavity and the transparent substrate and not the adhesive with low transmittance, thus, mitigating the light influence of the adhesive. However, conventionally, the structural strength of the dam structure is not sufficient enough, such that cracking, delaminating, and/or bending may occur at interfaces, such as a the bonding interface between the dam structure and the transparent substrate. In addition, the transparent substrate used is conventionally a glass substrate, which has relatively higher costs and may weigh too much.

With the increasing development of the semiconductor manufacturing process, electronic devices are being formed in smaller and smaller dimensions. However, due to the ever-decreasing size and the ever-increasing density of the electronic devices, the complexity of dense and functional package structures of electronic devices have increased.

Thus, a novel package structure for improving the electronic device package of electronic devices and method for forming the same is desired.

BRIEF SUMMARY OF THE INVENTION

In accordance with an embodiment of the invention, a method for forming an electronic device package is provided, comprising: providing a carrier substrate having an upper surface and an opposite second surface; forming a cavity from the upper surface of the carrier substrate; disposing an electronic device having a conducting electrode in the cavity; forming a filling layer in the cavity, wherein the filling layer surrounds the electronic device; thinning the carrier substrate from the lower surface to a predetermined thickness; forming at least a through-hole in the electronic device or in the carrier substrate; and forming a conducting layer over a sidewall of the through-hole, wherein the conducting layer electrically connects to the conducting electrode.

In accordance with another embodiment of the invention, an electronic device package is provided, comprising: a carrier substrate having at least an opening extending from an upper surface of the carrier substrate toward an opposite lower surface; a filling layer located in the opening; an electronic device located in the opening and surrounded by the filling layer, wherein the electronic device has a conducting electrode; and a conducting layer overlying a sidewall of the through-hole and electrically connecting to the conducting electrode.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

An embodiment of the invention provides an electronic device package having a material layer directly cured from a liquid state serving as an upper package layer, wherein the liquid state material is cured to form a transparent upper package layer. Another embodiment of the invention provides an electronic device package having a through substrate via (TSV), wherein the through substrate via and a redistribution layer are used for forming the conducting route between an electronic device in the electronic device package and other electrical elements outside of the electronic device package. The steps for forming the embodiment of the invention are illustrated in the accompanying drawings, wherein similar reference numbers are used to designate similar elements.

Figure 1A:
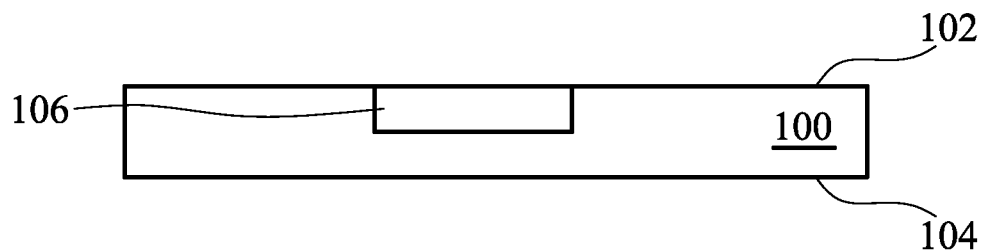
FIGS. 1A-1D are cross-sectional views showing the steps for forming an electronic device package in accordance with an embodiment of the present invention.

FIGS. 1A-1D are cross-sectional views showing the steps for forming an electronic device package in accordance with an embodiment of the present invention. As shown in FIG. 1A, a substrate 100 having an electronic device is first provided. The substrate 100 has a first surface 102 and an opposite second surface 104. The substrate 100 may be a silicon substrate, semiconductor substrate, compound semiconductor substrate, semiconductor wafer, sapphire substrate, or combinations thereof. The electronic device package of the embodiment of the invention includes a wafer-level package. The electronic devices are first packaged at the wafer level and then cut into individual packages. However, in another specific embodiment, separate electronic devices may be, for example, redistributed on a carrier wafer for a following packaging process, which may also be called a wafer level packaging process. A stacking process may also be used in the wafer level packaging process mentioned above to stack a plurality of wafers having electronic devices to form a multi-layered electronic device packaged product.

In one embodiment, the substrate 100 includes an electronic device 106 exposing a first surface 102. The electronic device 106 may be any kind of photoelectric device, such as a light detecting device, solar cell, or light emitting device. The electronic device 106 may also be a micro electro mechanical system (MEMS), micro fluidic system, physical sensor for detecting physical changes such as a detecting heat, light, or pressure, RF circuit device, accelerator, gyroscope, micro actuator, surface acoustic wave device, pressure sensor, or ink printer heads. To protect the electronic device 106, especially photoelectric devices, from being contaminated or damaged, a transparent upper package layer is necessary to be formed thereon to provide protection and ensure light transmission.

Then, a material layer directly cured from a liquid state is directly formed on the first surface 102. The material layer has a substantially planar upper surface and a transmittance of more than about 90%. Instead of the conventional glass substrate, adhesive, and/or dam structure, the material layer cured from a liquid state may serve as an upper package layer of an electronic device package according to an embodiment of the present invention. In one embodiment, there is no adhesive between the upper package layer and the first surface 102.

Figure 1B:
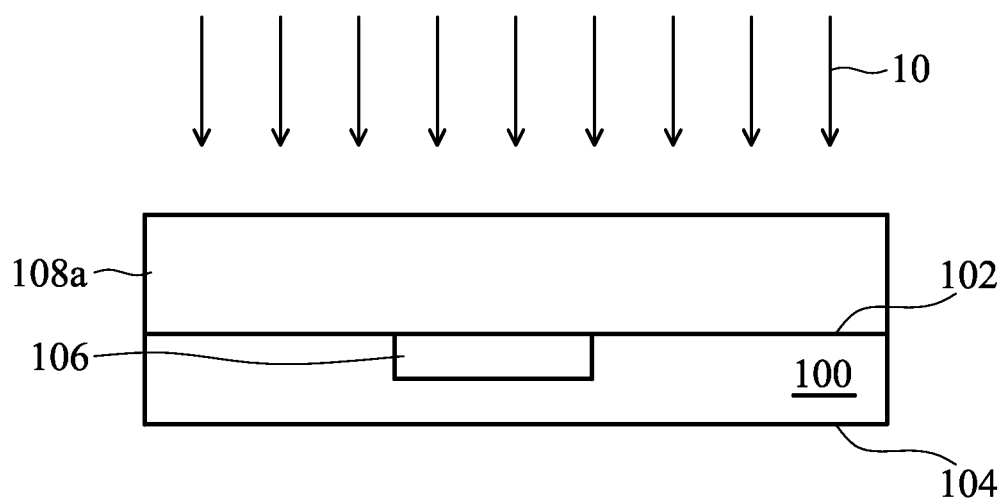
Figure 1C:
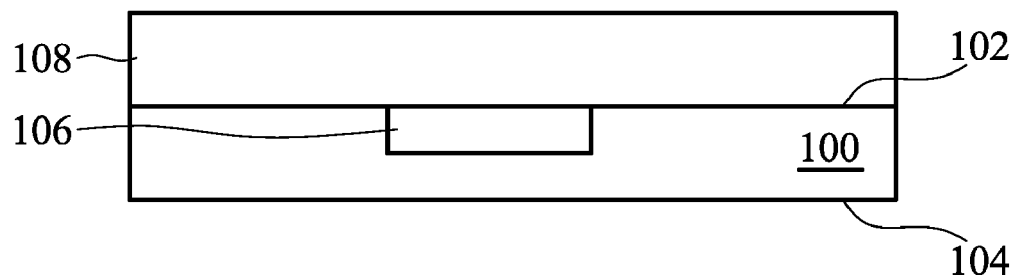

FIGS. 1B-1C show the forming of the upper package layer 108 directly cured from a liquid state in an embodiment of the invention. As shown in FIG. 1B, a fluid liquid state material 108a is applied directly on the first surface 102 of the substrate 100. Due to the fluid characteristics of the liquid state material 108a, a coating film or a coating gel having a substantially planar upper surface may be formed. The liquid state material 108a may be applied directly on the first surface 102 of the substrate 100 by many different wet coating methods, such as a bar coating, spin coating, curtain coating, or spray coating method.

The liquid state material 108a includes a polymer material which is transparent after being cured. The liquid state material 108a is preferably a thermosetting polymer material such that the upper package layer 108 cured from the liquid state material 108a may have enough hardness, for example, a hardness higher than Rockwell hardness of 100, and heat resistance. A suitable liquid state material 108a may include, but is not limited to, novolac phenol epoxy resin, such as a the novolac phenol epoxy resin of CAS No. 28906-96-9. In another embodiment, the novolac phenol epoxy resin may be mixed with, for example, gamma butyrolactone (CAS No. 96-48-0) to form the liquid state material 108a. In addition, another additive may be added, such as a triarylsulfonium hexafluoroantimonate salt (CAS No. 109037-75-4) or/and propylene carbonate (CAS No. 108-32-7).

In one embodiment, a polymer material suitable for use as the liquid state material 108a is heated to a temperature substantially higher or near the glass transition temperature of the polymer material such that the polymer material becomes fluid. Then, the fluid polymer material is applied on the first surface 102. In one embodiment, due to the fluid characteristics of the polymer material, the applied polymer material is a coating film or a coating gel having a substantially planar upper surface. In addition, the substrate 100 may be placed on a rotatable plate. By using a method similar to spin coating, the polymer material (liquid state material 108a) may cover the first surface 102 evenly and have a substantially planar upper surface. Because the polymer material may still have a specific viscosity even at a temperature higher than its glass transition temperature, the polymer material (liquid state material 108a) does not flow away from the first surface 102 completely. However, a blocking structure (not shown) may be formed on the peripheral region of the first surface 102 of the substrate 100 to prevent the liquid state material 108a from flowing away before being cured. Alternatively, a blocking structure (not shown) may be formed on the rotatable plate supporting the substrate 100 and surrounding the substrate 100. In addition, a suitable solvent may be added into the liquid state material 108a to adjust fluid characteristic.

Then, the liquid state material 108a may be irradiated by, for example, an ultraviolet ray to cause cross-linking to occur in the liquid state material 108a. The liquid state material 108a is thus cured into a solid state thereafter and forms the upper package layer 108 as shown in FIG. 1C. The cured upper package layer 108 has a substantially planar upper surface. In one embodiment, the upper package layer 108 directly cured from the liquid state material has a thickness larger than about 10 μm, preferably between about 1 μm and 5 μm. In addition, the cured upper package layer formed by the method mentioned above has a lower coefficient of thermal expansion, thus ensuring reliability and stability of the electronic device package.

In the embodiments mentioned above, the upper package layer 108 has a substantially planar upper surface, wherein the "substantially planar" means that a distance between a highest position and a lowest position of the upper surface of the upper package layer 108 is very small without influencing the input and/or output of light thereto and/or therefrom. For example, in one embodiment, the distance between the highest position and the lowest position of the upper surface of the upper package layer 108 is less than about 3 μm, preferably less than about 1 μm. However, it should be appreciated that depending on the wavelength of the light transmitted and the size of the electronic device package, the distance between the highest position and the lowest position of the upper surface of the upper package layer 108 may be different but is not limited to a specific range. Because the upper package layer 108 includes transparent polymer material and has a substantially planar upper surface, the electronic device 106 may receive light and/or emit light through the transparent upper package layer 108 directly cured from a liquid state without refraction or scattering problems.

In addition, another additive, such as a hardener, may be added into the upper package layer 108. Other additives may be added directly into the liquid state material 108a. Moreover, a phosphor material, such as a phosphor powder, may be added into the upper package layer 108 to adjust the wavelength of the light transmitted into or out from the electronic device package. The phosphor material may not only be added into the upper package layer 108 but also overly the upper package layer 108. For example, a phosphor powder layer may be formed on the upper package layer 108. In addition, other optical elements may be formed on the electronic device 106 or on the upper package layer 108 according to the requirements. For example, a microlens array, filter, antireflective coating, polarizer, dichroic filter, optical grating, optical wave guide, and so on, may be formed on the electronic device 106.

Figure 1D:
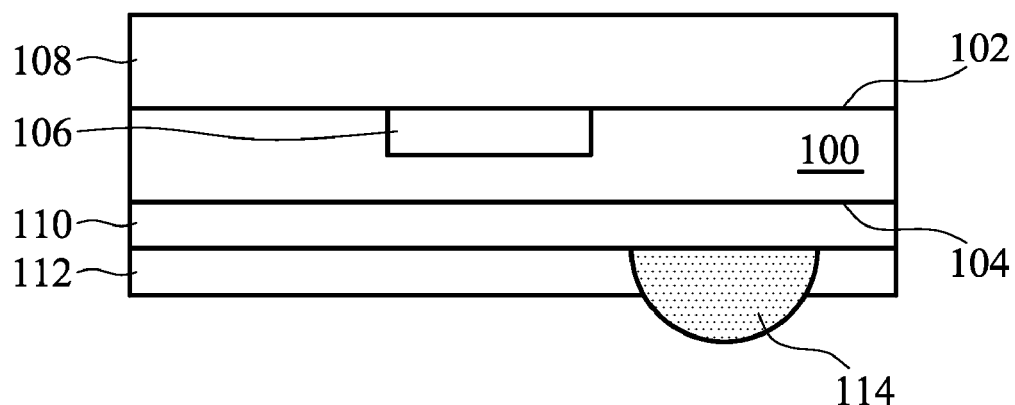

Referring to FIG. 1D, different conventional methods may be used to form the conducting structure 114, such as a conducting bump, on the second surface 104 of the substrate 100. Many different conducting routes (not shown) may be formed between the conducting structure 114 and the electronic device 106. An insulating layer 110 and a passivation layer 112 may be formed between the conducting structure 114 and the substrate 100. In one embodiment, a conducting bump is used as the conducting structure 114. The passivation layer 112 may be patterned to form an end point contact opening exposing the surface of the conducting route (not shown). Then, solder joints can be filled into the opening by either plating through a patterned photo-resist or screen printing through a stencil mask. A final stripping process of seed layers and/or a photo-resist process followed by a solder re-flow process completes the bumping process. The conducting structure 114 electrically connecting to the electronic device 106 may serve as a conductive bridge between the electronic device 106 and other electrical elements or circuits outside of the electronic device package. The insulating layer 110 may include an epoxy resin, solder mask material, or other suitable insulating material, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The insulating layer 110 may be formed by a coating method, such as a spin coating, spray coating, or curtain coating method, or other suitable deposition methods, such as a liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition.

Figure 2A:
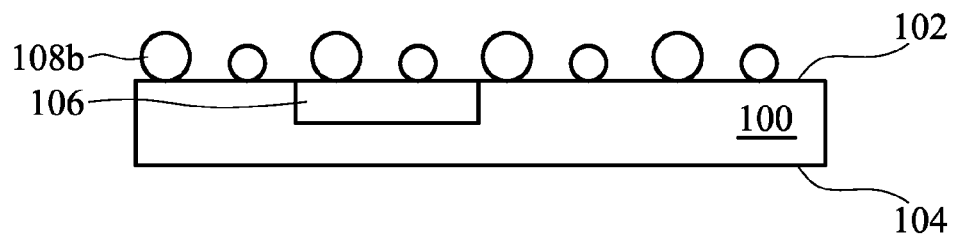
FIGS. 2A-2C are cross-sectional views showing the steps for forming an electronic device package in accordance with another embodiment of the present invention.
Figure 2B:
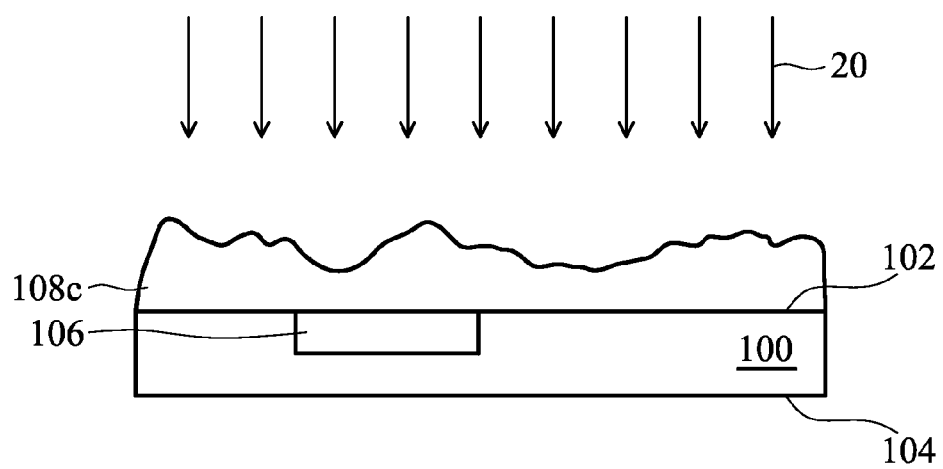
Figure 2C:
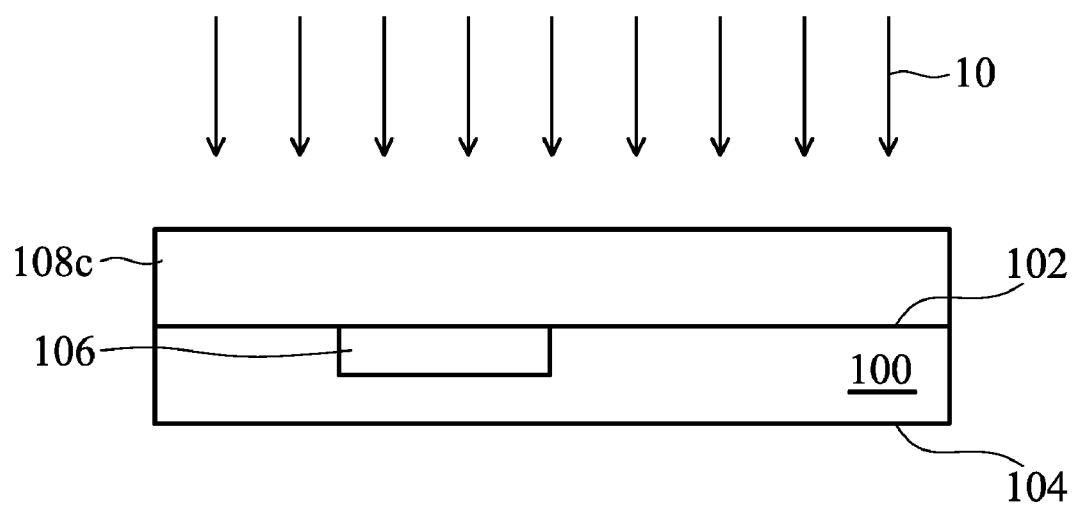

In the foregoing embodiments, a fluid liquid state material 108a is applied directly on the first surface 102. However, embodiments of the invention are not limited thereto. FIGS. 2A-2C are cross-sectional views showing the steps for forming an electronic device package in accordance with another embodiment of the present invention.

As shown in FIG. 2A, a solid state granular material 108b is disposed on the first surface 102. Then, as shown in FIG. 2B, the granular material 108b is irradiated with an infrared ray 20 to heat the granular material 108b. When the temperature of the heated granular material 108b is higher than its glass transition temperature, the granular material 108b transforms into a fluid liquid state material 108c. Then, similar to the embodiment shown in FIG. 1B, the fluid liquid state material 108c may flow naturally or the substrate 100 may be rotated, such that the upper surface of the liquid state material 108c may have a substantially planar upper surface as shown in FIG. 2C. In one embodiment, the structure shown in FIG. 2B is placed on a rotatable plate (not shown) and is rotated, as well as irradiated with the infrared ray 20 at the same time. Note that by tuning the rotating speed of the rotatable plate and the wavelength and/or the intensity of the infrared ray 20, the surface morphology of the liquid state material 108c may be controlled to be substantially planar as shown in FIG. 2C. For example, during the process when the upper surface of the liquid state material 108c is becoming planar, the intensity of the infrared ray 20 and/or the rotating speed of the rotatable plate may be gradually reduced. Thus, the fluid characteristics of the liquid state material 108c may be reduced gradually and its morphology may be fixed. Finally, as shown in FIG. 2C, an ultraviolet ray 10 may be used to irradiate the liquid state material 108c to form an upper package layer (not shown), similar to the upper package layer 108 shown in FIG. 1C. Similarly, in other embodiments, a transparent upper package layer having a substantially planar upper surface may be obtained by tuning the fluid characteristics of the liquid state material by controlling the temperature of the liquid state material 108c. Then, a conducting structure may be formed by a process similar to that shown in FIG. 1D.

Embodiments of the present invention have many advantageous features. For example, because the glass substrate on the first surface 102 is replaced by the upper package layer 108 directly cured from a liquid state, the adhesive transmittance problem of conventional packages is prevented. Also, due to elimination of the glass substrate on the first surface 102, manufacturing cost and process time are reduced. Meanwhile, in some embodiments, transparency and planar characteristics of the upper package layer 108 can withstand higher environmental temperatures when compared to conventional package, if a transparent thermosetting polymer material, having high heat resistance, is used as the upper package layer 108 directly cured from a liquid state. In addition, because weight of the upper package layer 108 directly cured from a liquid state is lighter than that of a glass substrate, applicability for portable electronic devices is increased. Meanwhile, it is not necessary anymore to use a dam structure, with poor structural strength, thus the reliability of the electronic device package is improved.

The material layer directly cured from a liquid state (or the upper package layer) may be adopted in many different packages. In the following description, an exemplary electronic device package having a through substrate via (TSV) according to an embodiment of the invention is described. However, it should be appreciated that embodiments of the invention are not limited thereto.

Figure 3A:
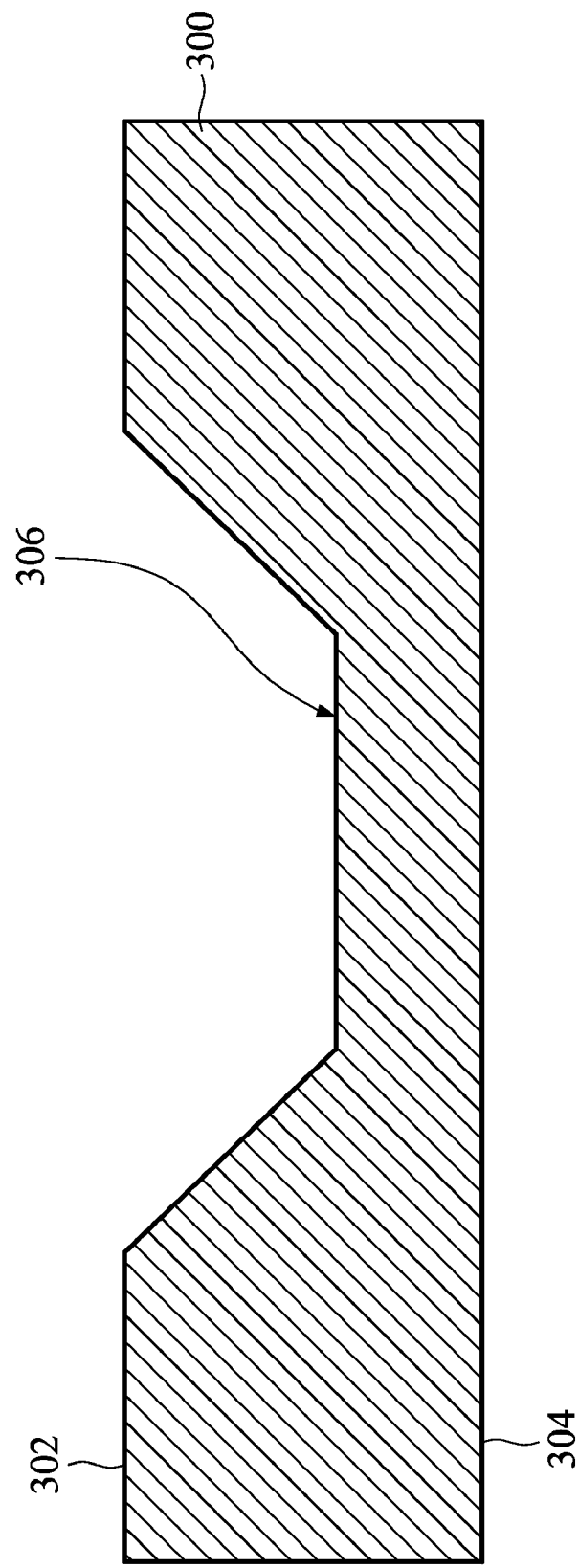
FIGS. 3A-3L are cross-sectional views showing the steps for forming an electronic device package having a through substrate via in accordance with yet another embodiment of the present invention.

FIGS. 3A-3L are cross-sectional views showing the steps for forming an electronic device package having a through substrate via in accordance with yet another embodiment of the present invention. Referring to FIG. 3A, a carrier substrate 300 having an upper surface 302 and an opposite lower surface 304 is provided. The carrier substrate 300 may include a silicon substrate, semiconductor substrate, compound semiconductor substrate, semiconductor wafer, sapphire substrate, or combinations thereof.

Then, at least a cavity 306 is formed from the upper surface 302. It should be appreciated that in a preferable embodiment, the carrier substrate 300 is preferably a silicon wafer having a plurality of cavities 306 formed therein. A plurality of electronic devices may be disposed in the cavity, followed by packaging and cutting processes, before obtaining a plurality of electronic device packages. The cavity 306 may be formed by, for example, a photolithography and etching process.

Figure 3B:
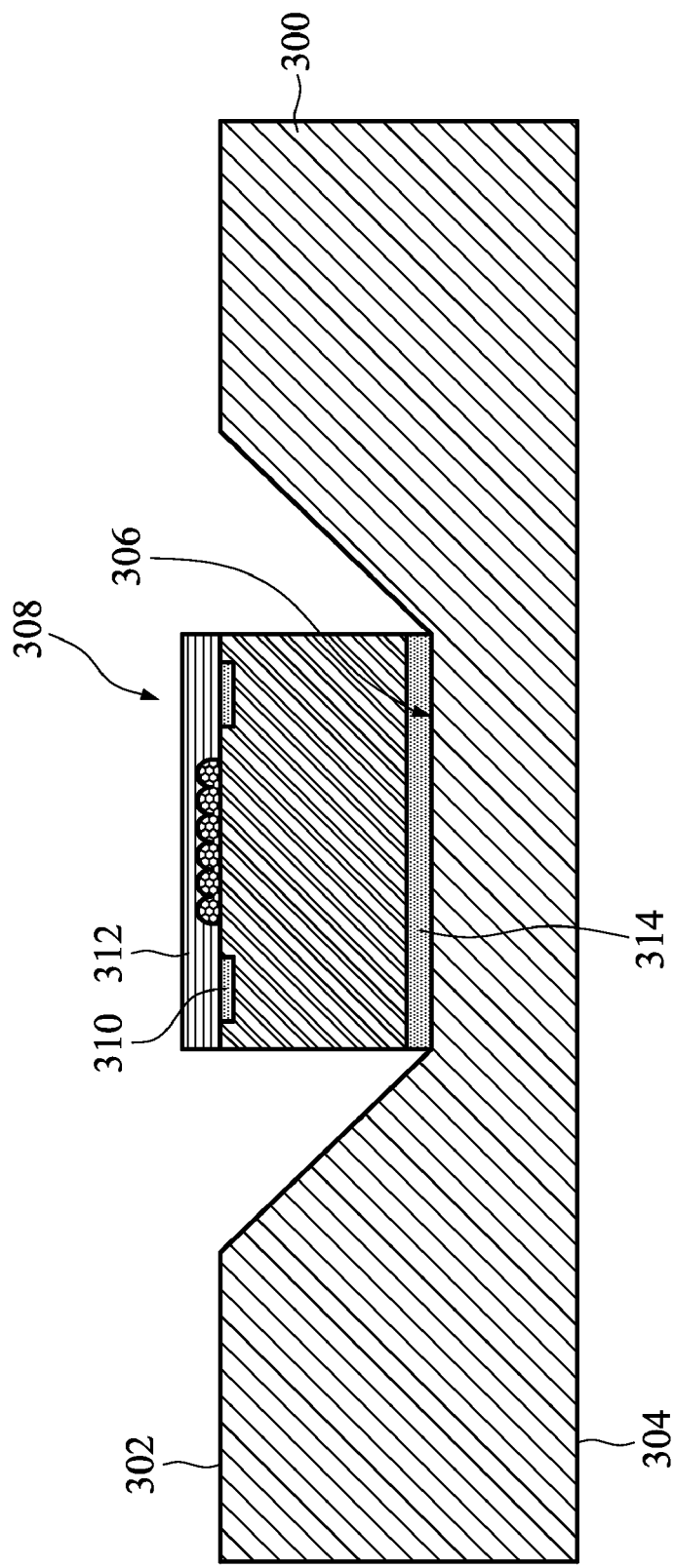

Referring to FIG. 3B, an electronic device 308, for example a chip, having a conducting electrode is disposed in the cavity 306. For example, the electronic device 308 may be fixed on a bottom portion of the cavity 306 by, but is not limited to, an adhesive layer 314. In the embodiment, the electronic device 308 has a conducting electrode 310 and is covered by an upper package layer 312, wherein the upper package layer 312 overlies the conducting electrode 310. The conducting electrode 310 may serve as a conducting route between electronic devices in the electronic device 308 and the electronic device package. The conducting electrode 310 may be a portion of the interconnections of the electronic device. The electronic device in the electronic device 308 may include, but is not limited to, a micro electro mechanical system (MEMS), micro fluidic system, physical sensor for detecting physical changes such as detecting heat, light, or pressure, RF circuit device, accelerator, gyroscope, micro actuator, surface acoustic wave device, pressure sensor, light detecting device, light emitting device, or ink printer heads. The upper package layer 312 may protect the electronic devices in the electronic device 308. When the electronic device is a photoelectric device, such as a light emitting diode device, light detecting device, and/or photovoltaic cell, it is preferable to use a transparent material layer as the upper package layer 312. For example, the upper package layer 312 may adopt the upper package layer directly cured from a liquid state, similar to the embodiment shown in FIG. 1C. In another embodiment, the upper package layer 312 directly cured from the liquid state material has a substantially planar upper surface and a transmittance of more than about 90%. In yet another embodiment, there is no adhesive between the upper package layer 312 and the electronic device 308.

Figure 3C:
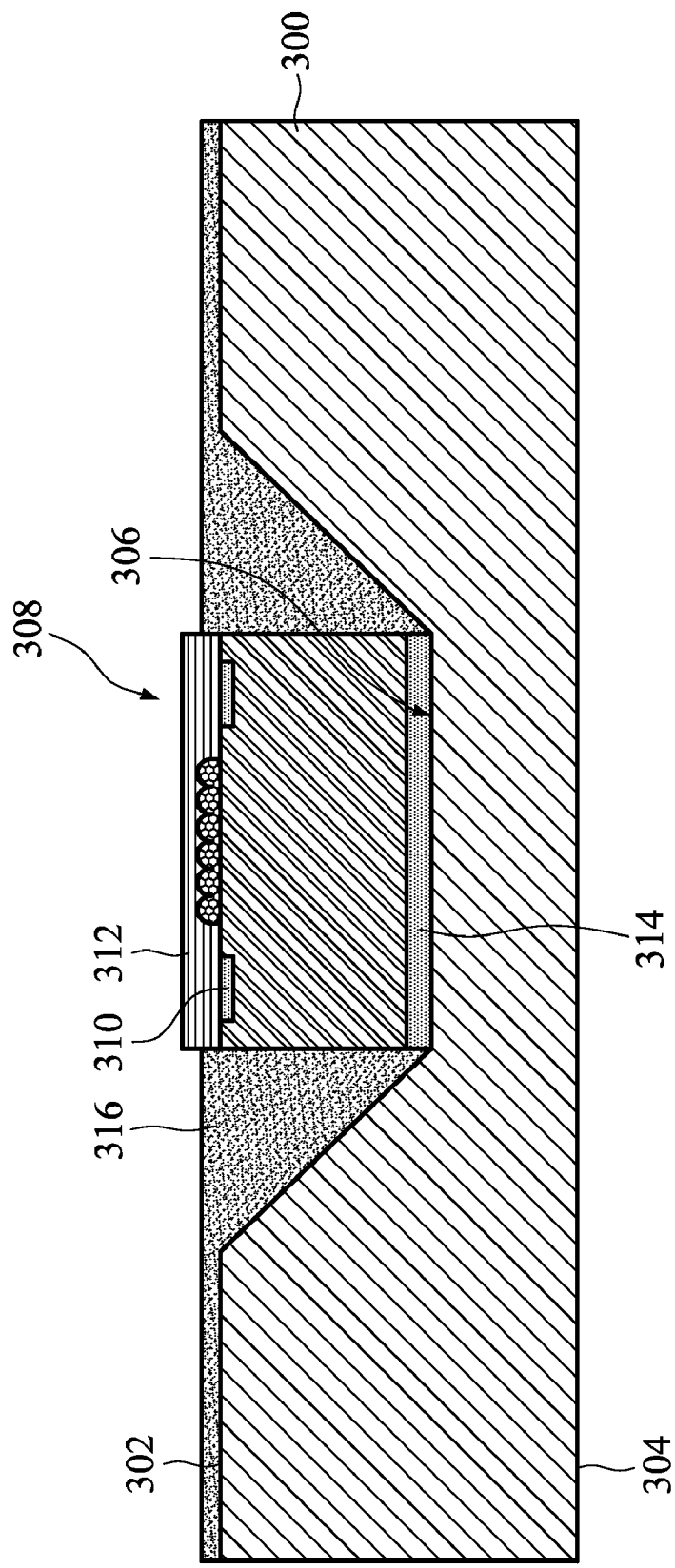

As shown in FIG. 3C, a filling layer 316 is then formed overlying the carrier substrate 300. The filling layer 316 fills the cavity 306 and surrounds the electronic device 308. The material of the filling layer 316 may include, for example, an epoxy resin, organic polymer material, such as a polyimide, butylcyclobutene (BCB, Dow Chemical Co.), silicon resin, or combinations thereof.

Figure 3D:
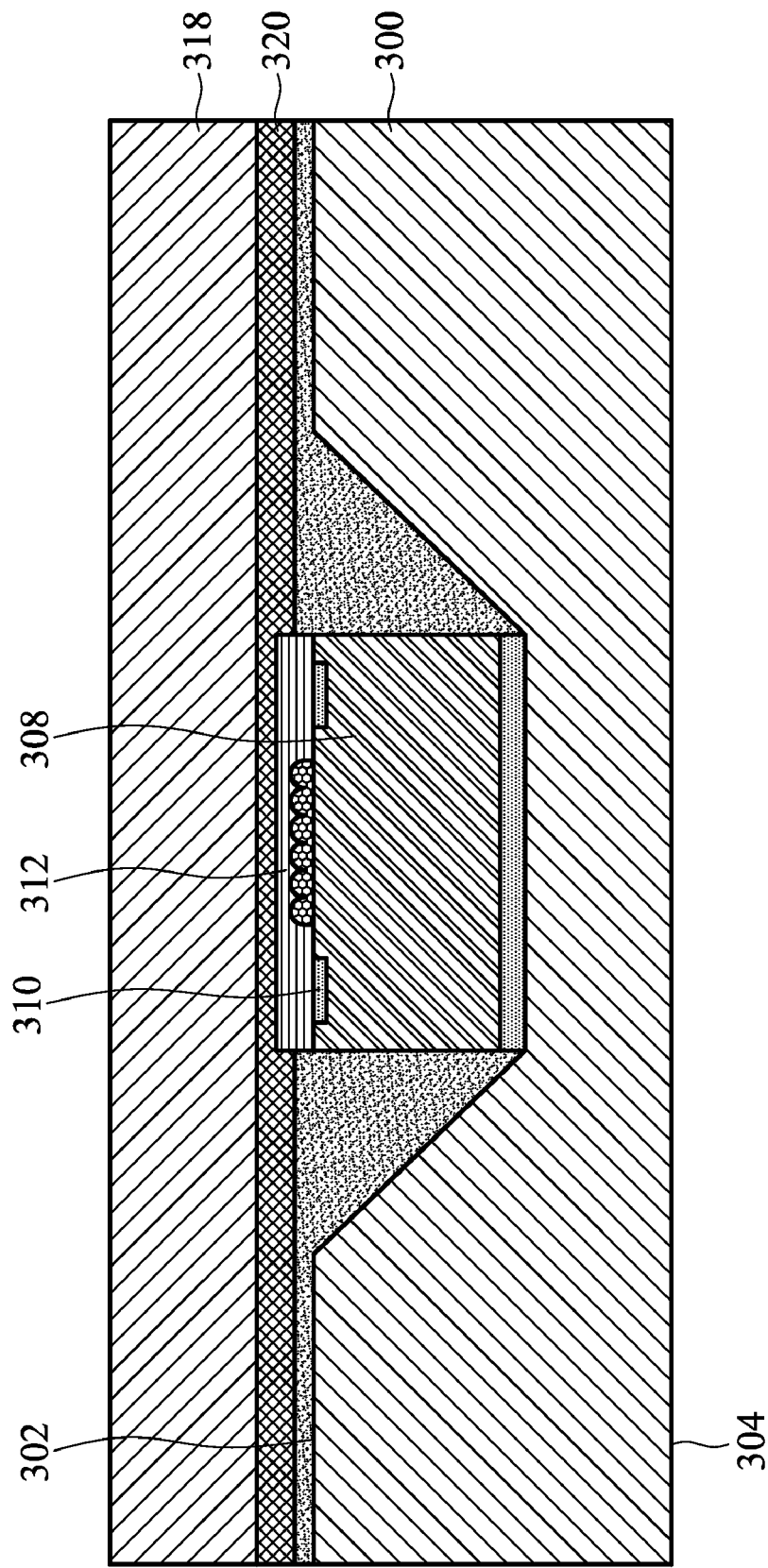
Figure 3E:
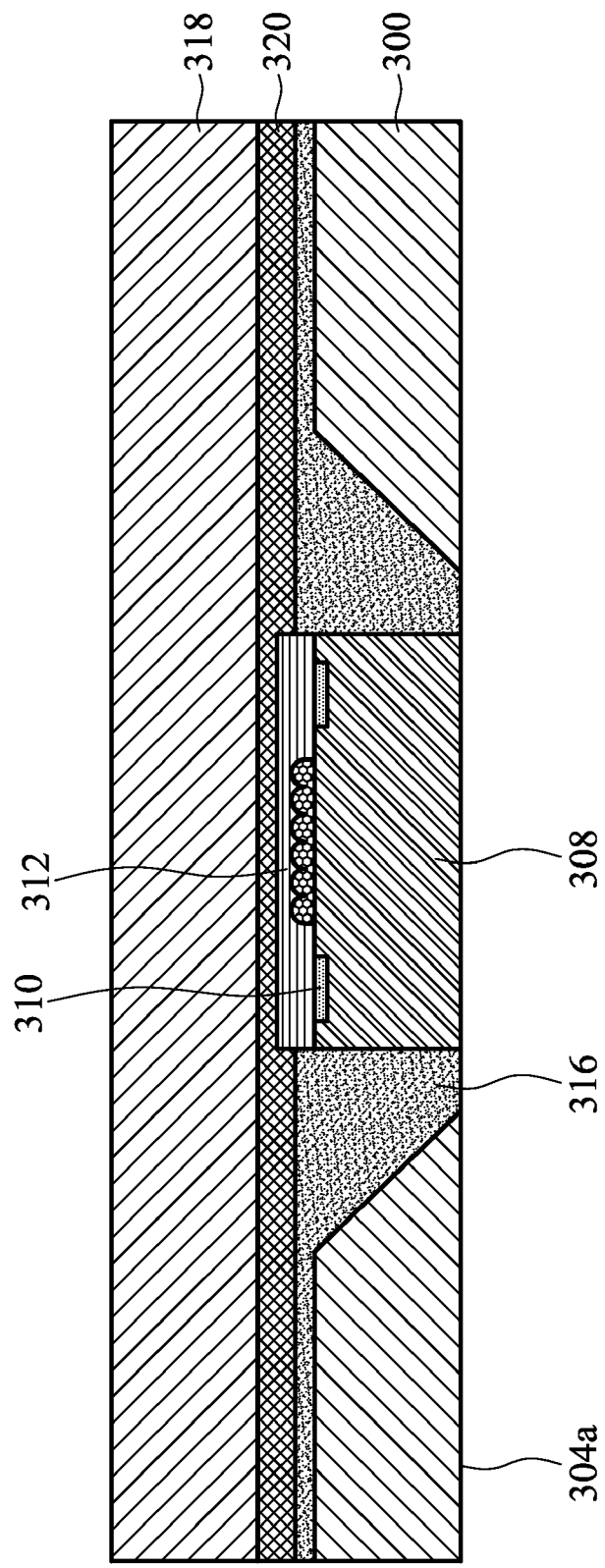

Then, as shown in FIGS. 3D and 3E, the carrier substrate 300 is thinned from the lower surface 304 to a predetermined thickness. In the embodiment, the carrier substrate 300 exposes a portion of the electronic device 308 and a lower surface 304a of the carrier substrate 300. Referring to FIG. 3D, to successfully proceed with the thinning process of the carrier substrate 300 and subsequent processes, it is preferable to fix the carrier substrate 300 on a recyclable temporary substrate 318. In one embodiment, a removable adhesive layer 320 may be applied on the carrier substrate 300 or/and the temporary substrate 318. Then, the carrier substrate 300 may be bonded with the temporary substrate 318 by the removable adhesive layer 320. The removable adhesive layer 320 may include, for example, a removable adhesive or removable adhesive tap. The removable adhesive includes, for example, an adhesive which can be removed after being heated, irradiated with light, or washed by solvents.

Referring to FIG. 3E, using the temporary substrate 318 as a support, the carrier substrate 300 is thinned from the lower surface 304 to a predetermined thickness to expose a portion of the electronic device 308 and the lower surface 304a. The carrier substrate 300 may be thinned by using, for example, a mechanical grinding or chemical mechanical polish (CMP) process. After the thinning process, a through-hole may be directly formed from the exposed lower surface of the electronic device without the necessity of using a plurality of etching processes. In one embodiment, a wet cleaning process may be performed to further clean the lower surface 304a.

Figure 3F:
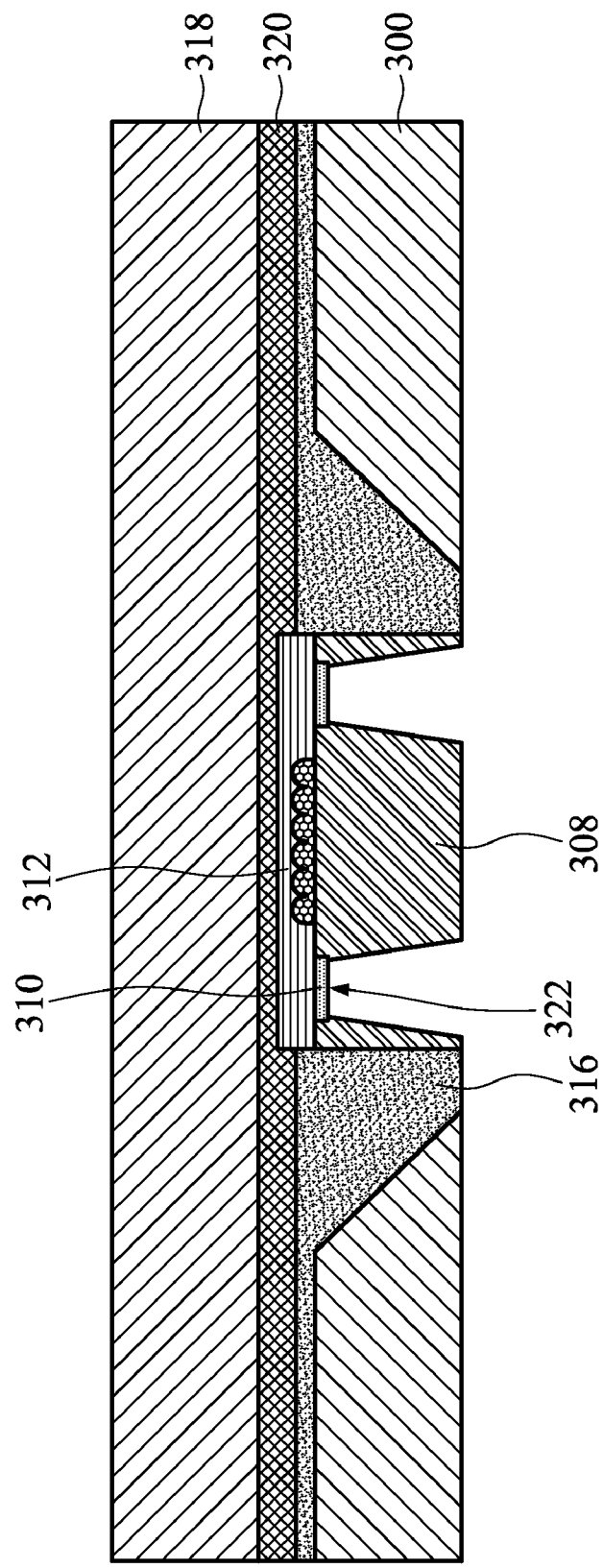

Then, as shown in FIG. 3F, at least a through-hole 322 is formed from the exposed electronic device 308. The through-hole 322 may underlie the conducting electrode 310 in or on the electronic device 308. The through-hole 322 may be formed by, for example, a photolithography and etching process or a laser drilling process. In one embodiment, the through-hole 322 exposes at least a portion of the conducting electrode 310. In the following process, when a conducting layer is formed overlying a sidewall of the through-hole 322, the formed conducting layer may further electrically connect the conducting electrode 310, forming a conductive bridge between the electronic device 308 and other electrical elements outside of the electronic device package.

Figure 3G:
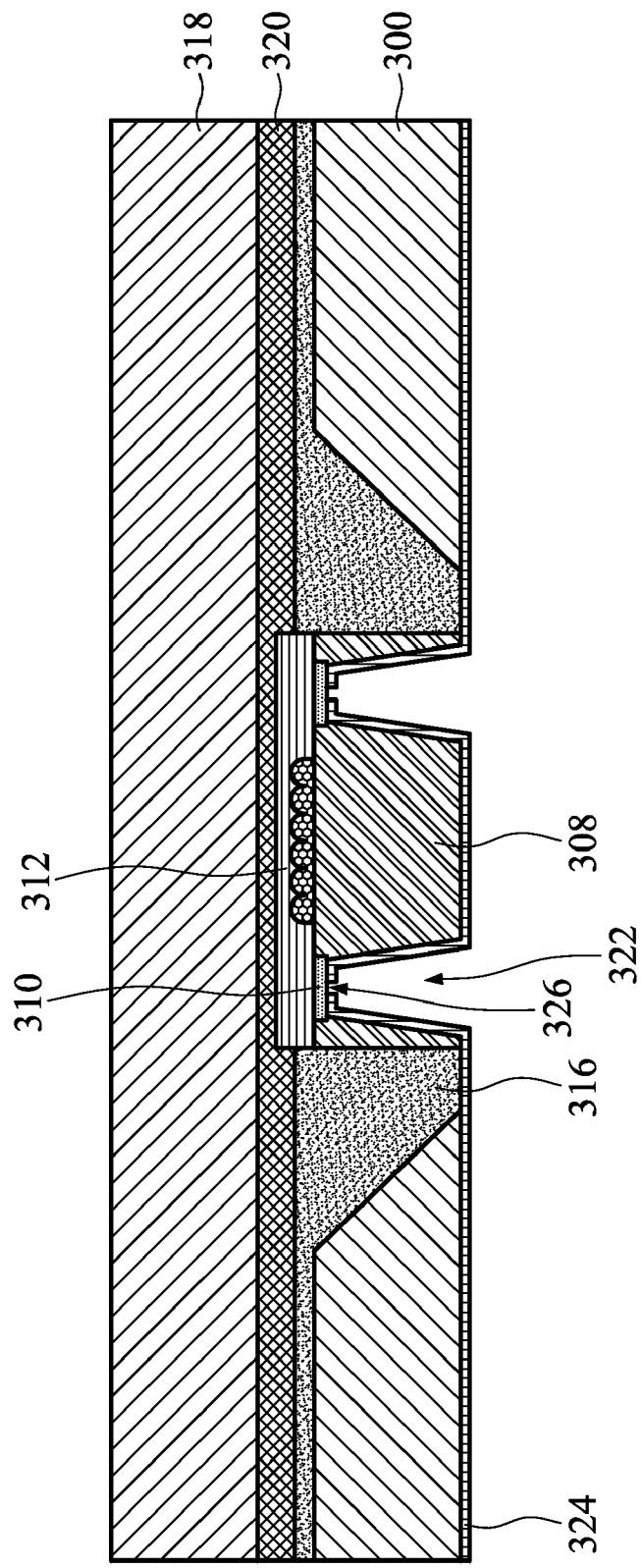

As shown in FIG. 3G, in order to prevent the conducting layer from directly contacting with the electronic device 308, which may cause a short, or to prevent the material of the conducting layer to diffuse into the electronic device 308 and influence operation thereof, it is preferable to form an insulating layer 324 overlying the sidewall and the bottom portion of the through-hole 322 before forming the conducting layer. The material of the insulating layer 324 may be an epoxy resin, solder mask material, or other suitable insulating material, such as an inorganic material including silicon oxide, silicon nitride, silicon oxynitride, metal oxide, or combinations thereof, or organic polymer material including polyimide, butylcyclobutene (BCB, Dow Chemical Co.), parylene, polynaphthalenes, fluorocarbons, or acrylates and so on. The insulating layer 324 may be formed by a coating method, such as a spin coating, spray coating, or curtain coating method, or other suitable deposition methods, such as a liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition.

After forming the insulating layer 324, it is preferable to form a first opening 326 in the insulating layer 324 to expose the conducting electrode 310. The first opening 326 may be formed by removing a portion of the insulating layer 324 by an energy beam, such as a laser beam, electron beam, or/and ion beam. In another embodiment, when the insulating layer 324 is a photoresist material, the first opening 326 is directly formed by an exposure and development process.

Figure 3H:
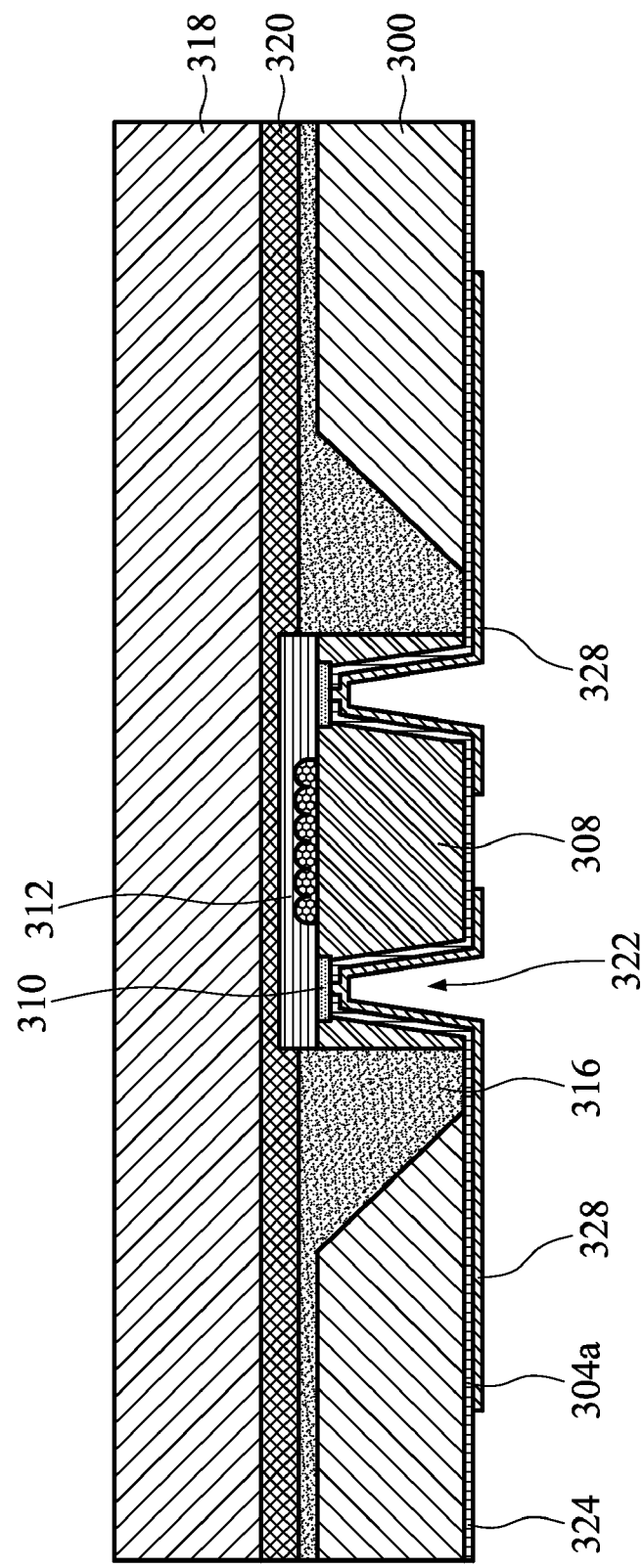

Referring to FIG. 3H, a conducting layer 328 is formed overlying the sidewall of the through-hole 322 and electrically connecting to the conducting electrode 310. In the embodiment, the conducting layer 328 further extends overlying the lower surface 304a of the carrier substrate 300. The material of the conducting layer 328 may include metal material, conducting polymer material, conducting ceramic material, or combinations thereof. The conducting layer 328 may be formed by a physical vapor deposition, chemical vapor deposition, or electrochemical plating process.

In one embodiment, the conducting layer 328 electrically connects to the conducting electrode 310 through the pre-formed first opening 326 in the insulating layer 324. Thus, the electronic device in the electronic device 308 may receive or/and send electrical signals through the conducting electrode 310 and the conducting layer 328. By having the conducting layer 328 extend from the sidewall of the through-hole 322 to the lower surface 304a, the interconnection layout area of the electronic device package can be increased, lowering the density of input and output (I/O) in a single plane. In addition, although the conducting layer 328 shown in the drawing is conformally formed overlying the sidewall of the through-hole 322, the conducting layer 328 may substantially fill the through-hole 322 in another embodiment. Then, the conducting route may be further extended to overly the lower surface 304a through a redistribution layer.

Figure 3I:
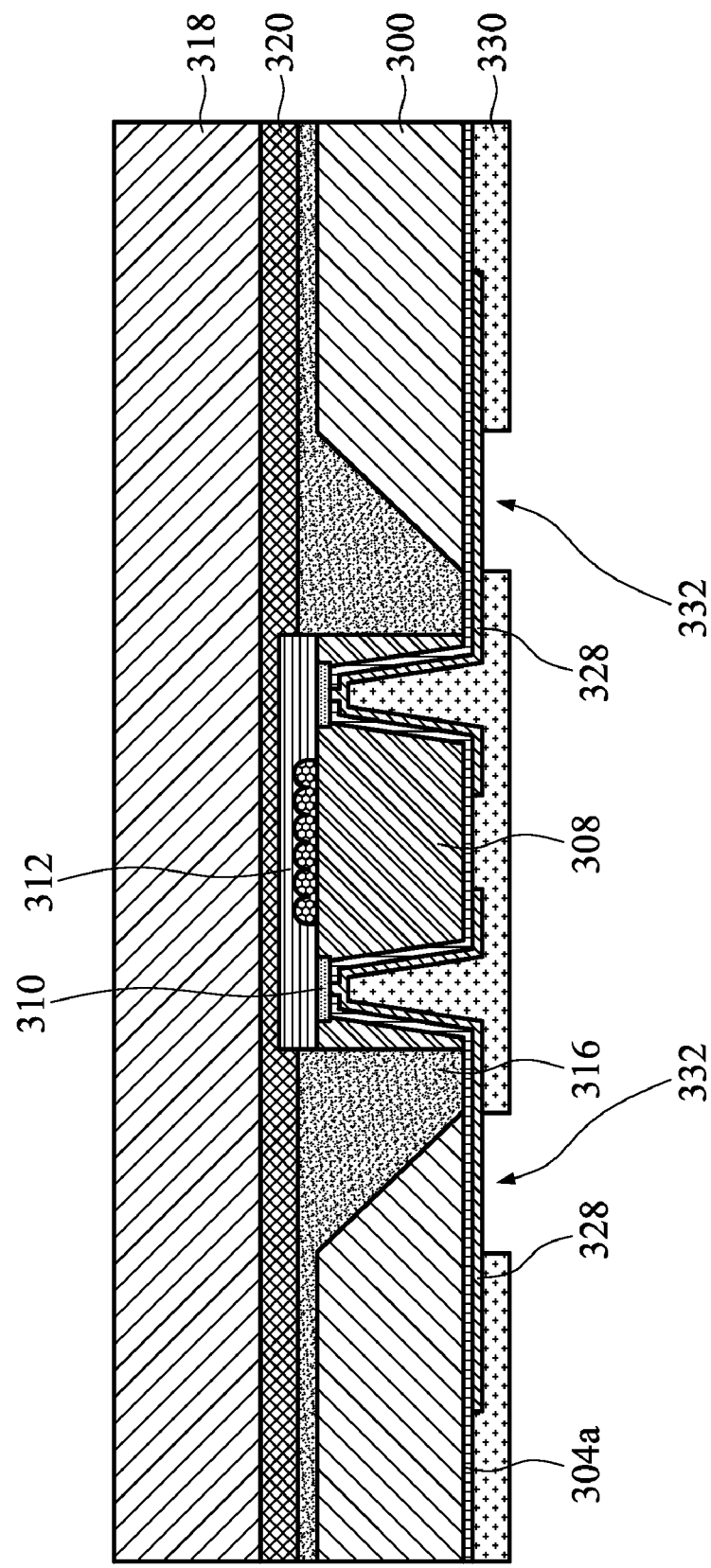
Figure 3J:
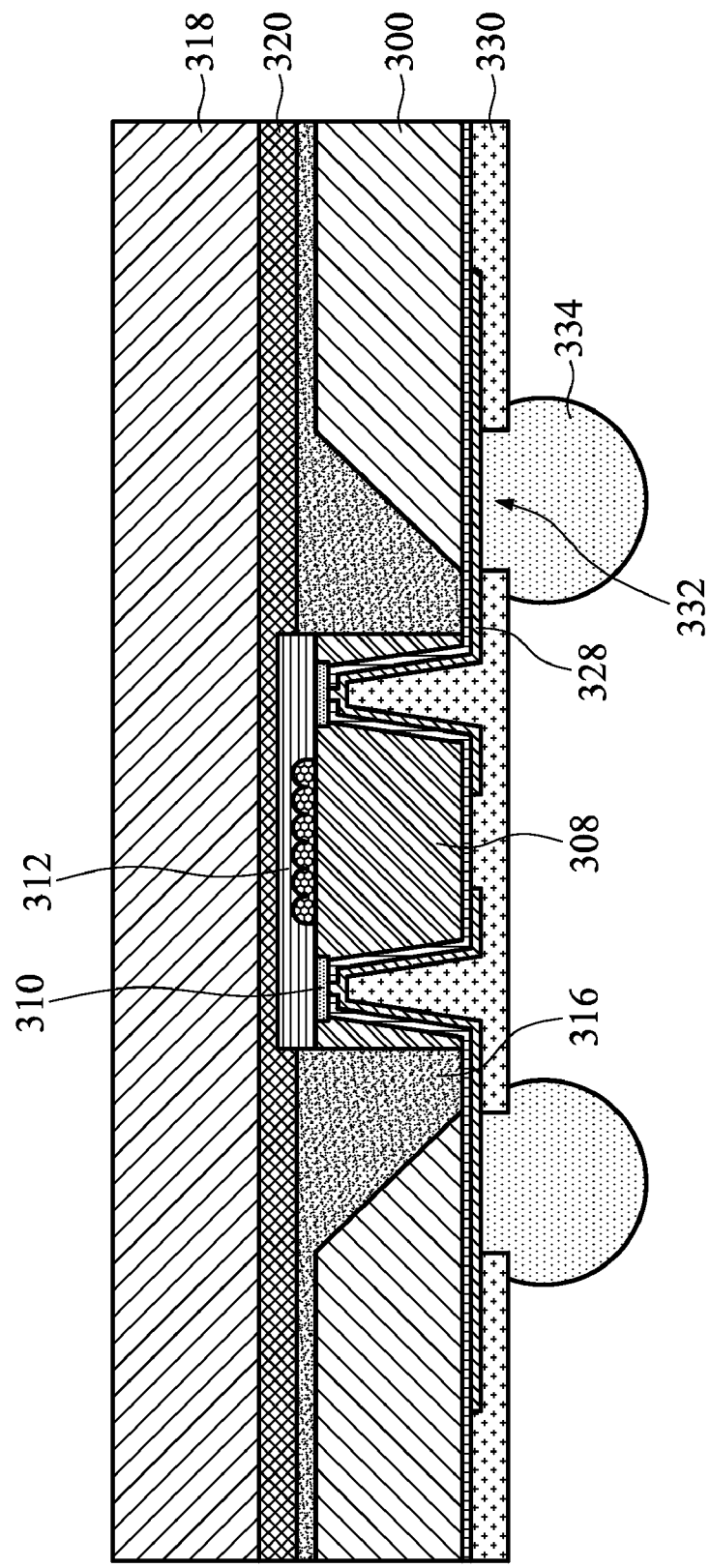

Referring to FIG. 3I, in an embodiment, a passivation layer 330 may be optionally formed overlying the lower surface 304a and the conducting layer 328. The material of the passivation layer may be, for example, a polymer material. The passivation layer 330 may be formed by a spray coating, ink jetting, dipping, chemical vapor deposition, or printing process, or combinations thereof. Then, a portion of the passivation layer 330 is removed to form at least a second opening 332. The passivation layer 330 may be removed by using any conventional method or energy beam. The second opening 332 exposes a portion of the conducting layer 328 to extend overlying the lower surface 304a, thus providing electrical contact region for other electrical elements outside of the electronic device package. For example, in one embodiment as shown in FIG. 3J, a conducting structure 334 is formed in the second opening 332. For example, a bumping process may be performed to form a solder ball (the conducting structure 334) to overly the exposed conducting layer 328. The formed electronic device package can protect the electronic device 308 therein and provide a conducting route to other outside electrical elements.

Figure 3K:
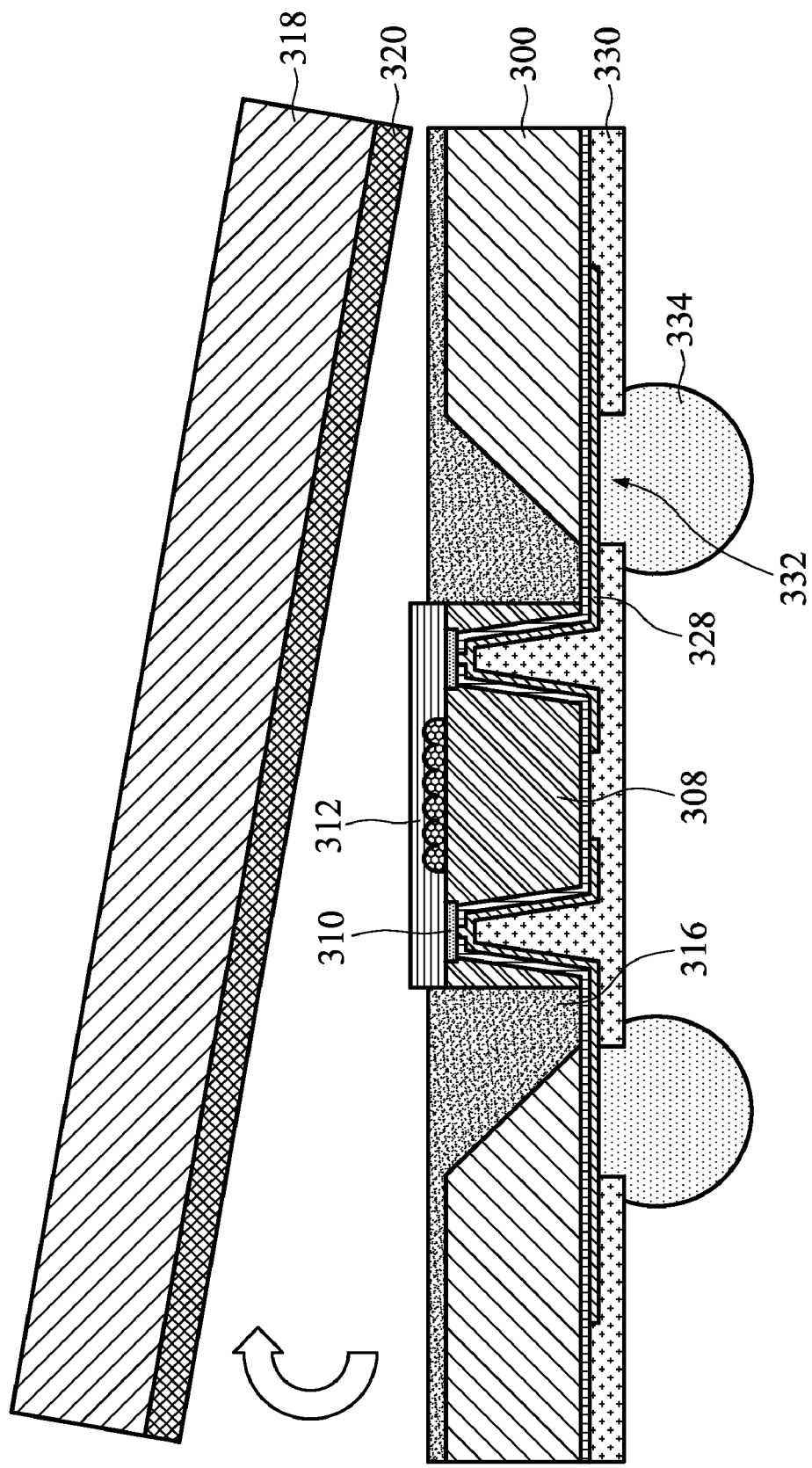

Then, as shown in FIG. 3K, the temporary substrate 318 and the removable adhesive layer 320 are removed from the carrier substrate 300 to obtain an electronic device package in accordance with an embodiment of the present invention. In on embodiment, the carrier substrate 300 is a wafer having a plurality of electronic devices 308 packaged thereon or therein. In the embodiment, a cutting process may be further performed to obtain at least a separate electronic device package. In addition, the cutting process may be performed before or after the step of removing the temporary substrate 318. For example, when the adhesive layer 320 is a removable adhesive tap, it is preferable to cut through the carrier substrate 300 to the adhesive layer 320 along a predetermined scribe line and not cut through the entire adhesive layer 320. Then, the temporary substrate 318 is removed in one step to obtain a plurality of electronic device packages. Thus, the entire temporary substrate 318 may be recycled for reuse. In another embodiment, after the temporary substrate 318 is entirely removed, the carrier substrate 300 is cut to separate a plurality of electronic device packages.

Figure 3L:
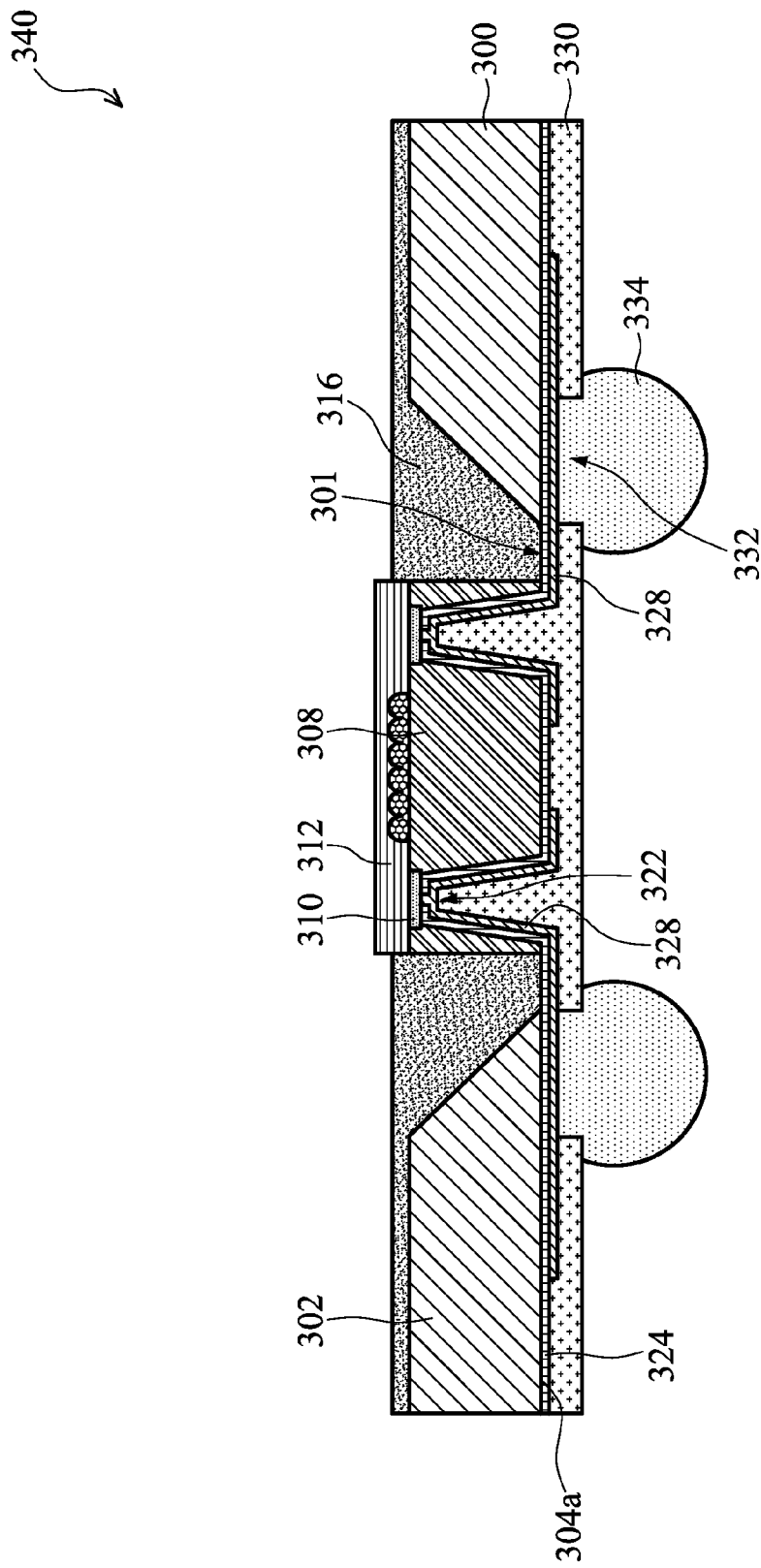

FIG. 3L shows an electronic device package 340 according to an embodiment of the present invention. The electronic device package 340 includes a carrier substrate 300 having at least an opening 301 extending from an upper surface 302 of the carrier substrate 300 toward an opposite lower surface. In the embodiment, the opening 301 penetrates the carrier substrate 300 from the upper surface 302 to an opposite lower surface 304a. The opening 301 is filled with a filling layer 316. An electronic device 308 is disposed in the opening 301 and is surrounded by the filling layer 316. The electronic device 308 has a conducting electrode 310 and at least a through-hole 322, and is covered by an upper package layer 312. A conducting layer 328 is formed overlying a sidewall of the through-hole 322 and further extends to overly the lower surface 304a and electrically connect to the conducting electrode 310. As shown in FIG. 3L, the conducting layer 328 provides an electrical route from the conducting electrode 310 of the electronic device 308 to the lower surface 304a of the carrier substrate 300, thus increasing interconnection layout area of the electronic device package and reducing the density of the input and output (I/O) in a single plane. For small sized electronic devices, the method and the structure provided in the embodiments of the invention increase layout area, reducing process difficulties with limited dense layout areas and improving product yield.

FIGS. 4A-4L are cross-sectional views showing the steps for forming an electronic device package having a through substrate via in accordance with yet another embodiment of the present invention. Compared with the embodiment shown in FIGS. 3A-3L, where the through substrate via is formed in the electronic device, the through substrate via in this embodiment is formed in the carrier substrate. In the embodiment shown in FIG. 4, similar reference numbers are used to designate similar elements.

Figure 4A:
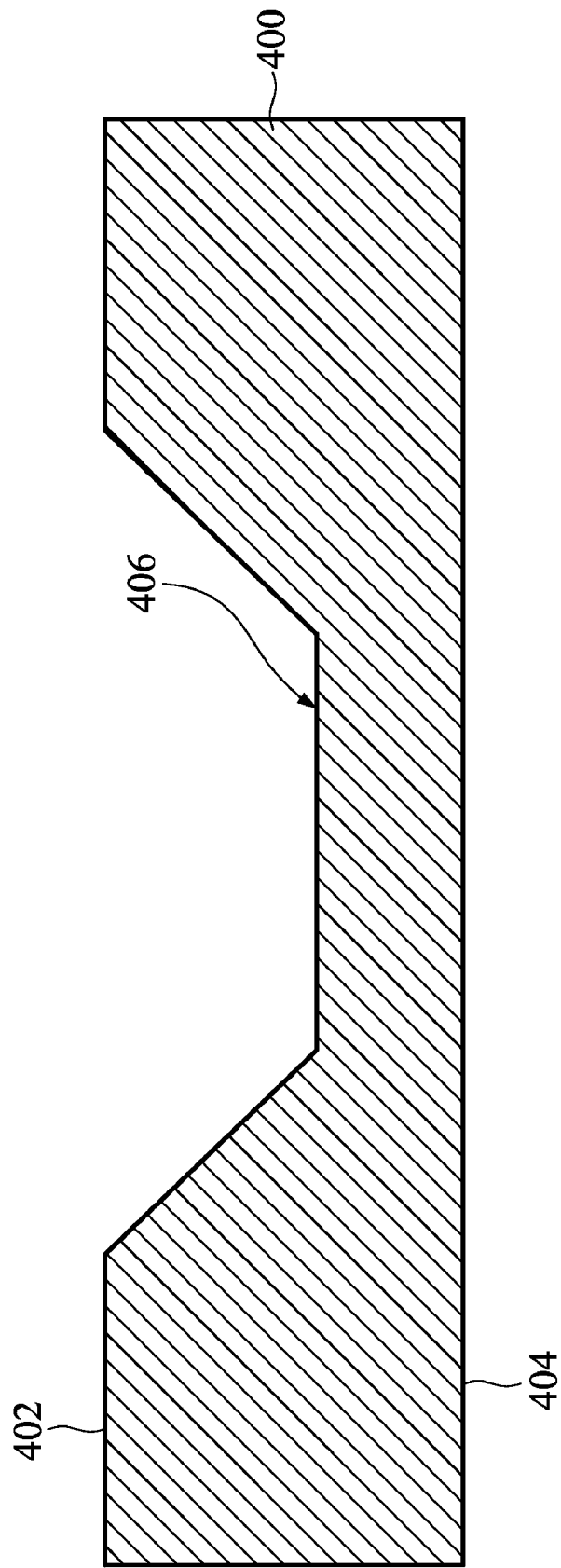
FIGS. 4A-4L are cross-sectional views showing the steps for forming an electronic device package having a through substrate via in accordance with yet another embodiment of the present invention.
Figure 4B:
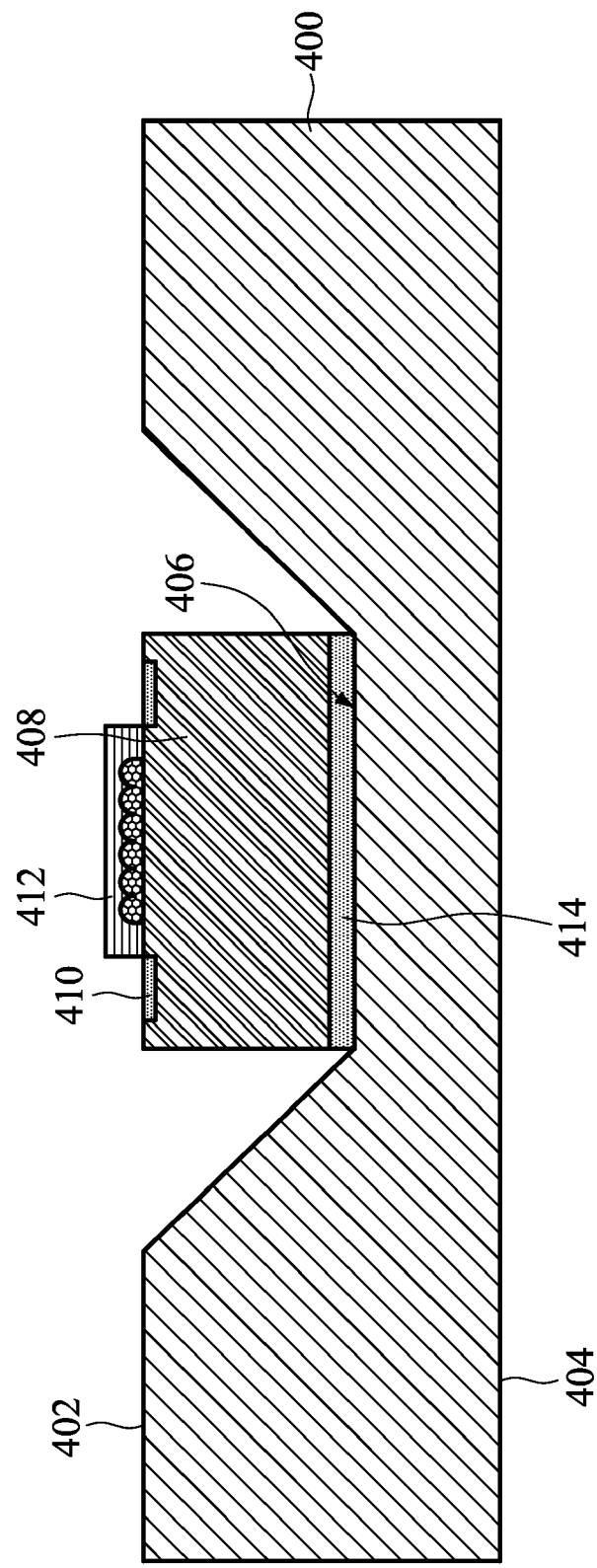

First, as shown in FIG. 4A, a carrier substrate 400 having an upper surface 402 and an opposite lower surface 404 is provided. The carrier substrate 400 may include a silicon substrate, semiconductor substrate, compound semiconductor substrate, semiconductor wafer, sapphire substrate, or combinations thereof. Then, at least a cavity 406 is formed from the upper surface 402. As shown in FIG. 4B, an electronic device 408, for example a chip, having a conducting electrode is disposed in the cavity 406. For example, the electronic device 408 may be fixed on a bottom portion of the cavity 406 by, but is not limited to, an adhesive layer 414. In the embodiment, the electronic device 408 has a conducting electrode 410 and is covered partly by an upper package layer 412, wherein the upper package layer 412 is overlying the conducting electrode 410. The electronic device in the electronic device 408 may include, but is not limited to, a micro electro mechanical system (MEMS), micro fluidic system, physical sensor for detecting physical changes such as a detecting heat, light, or pressure, RF circuit device, accelerator, gyroscope, micro actuator, surface acoustic wave device, pressure sensor, light detecting device, light emitting device, or ink printer heads. The upper package layer 412 may protect the electronic device 408. When the protected electronic device is a photoelectric device, such as a light emitting diode device, light detecting device, and/or photovoltaic cell, it is preferable to use a transparent material layer as the upper package layer 412. For example, the upper package layer 412 may adopt the upper package layer directly cured from a liquid state, similar to the embodiment shown in FIG. 1C. In another embodiment, the upper package layer 412 directly cured from the liquid state material has a substantially planar upper surface and a transmittance of more than about 90%. In yet another embodiment, there is no adhesive between the upper package layer 412 and the electronic device 408.

Figure 4C:
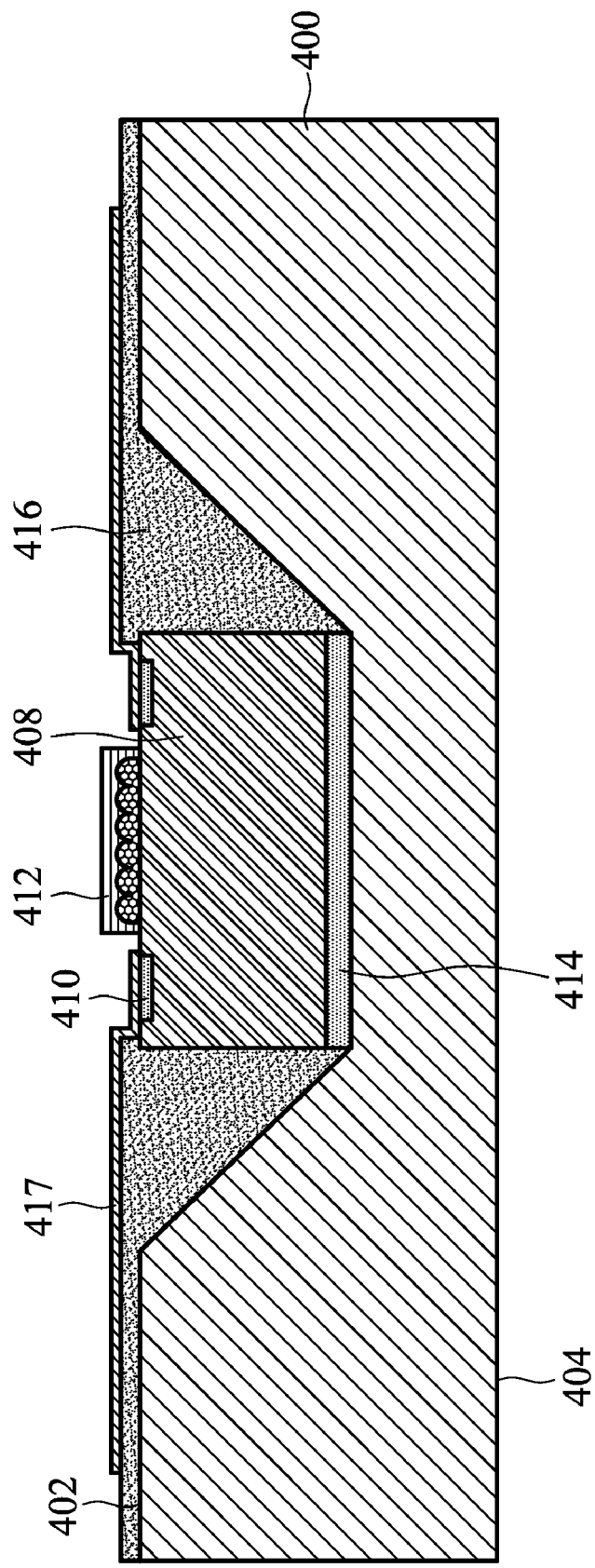

As shown in FIG. 4C, a filling layer 416 is then formed overlying the carrier substrate 400. The filling layer 416 surrounds the electronic device 408. Then, a redistribution layer 417 is formed overlying the filling layer 416. The redistribution layer 417 electrically connects to the conducting electrode 410 and extends overlying the upper surface 402. The redistribution layer 417 may include a metal material, conducting polymer material, conducting ceramic material, or combinations thereof. The redistribution layer 417 may be formed by a physical vapor deposition, chemical vapor deposition, or electrochemical plating process.

Figure 4D:
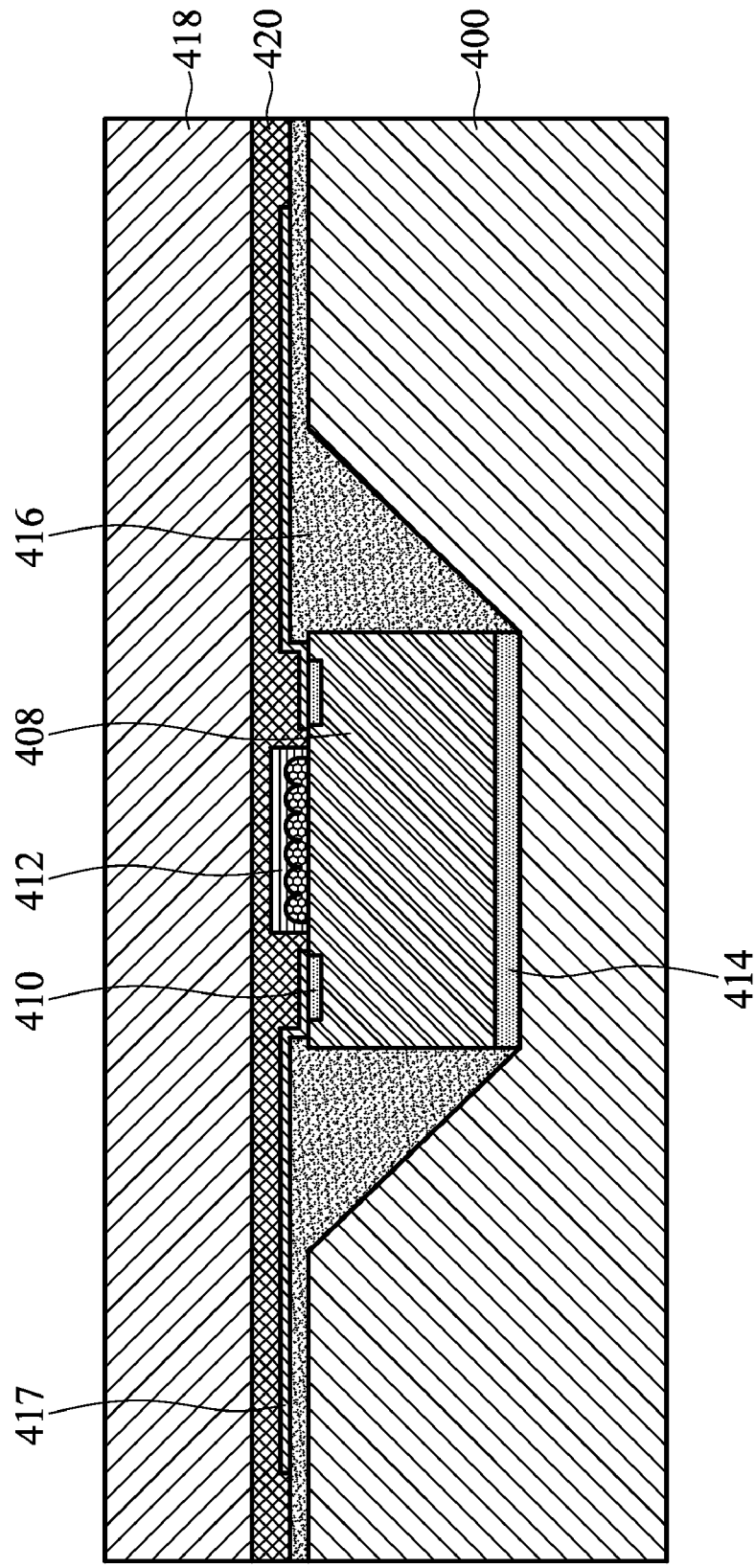
Figure 4E:
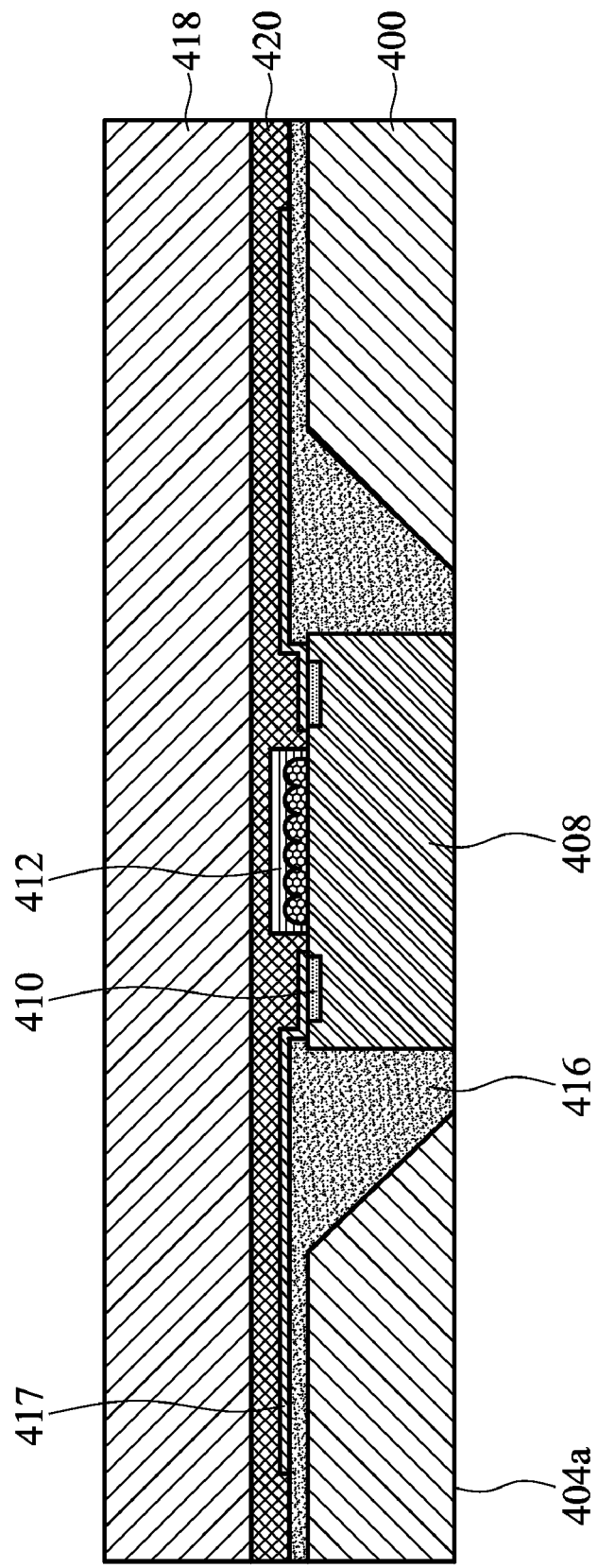

Then, as shown in FIGS. 4D and 4E, the carrier substrate 400 is thinned from the lower surface 404 to a predetermined thickness. In the embodiment, the carrier substrate 400 exposes a portion of the electronic device 408 and a lower surface 404a of the carrier substrate 400. Referring to FIG. 4D, to successfully proceed with the thinning process of the carrier substrate 400 and subsequent processes, it is preferable to fix the carrier substrate 400 on a recyclable temporary substrate 418. In one embodiment, a removable adhesive layer 420 may be applied on the carrier substrate 400 or/and the temporary substrate 418. Then, the carrier substrate 400 may be bonded with the temporary substrate 418 by the removable adhesive layer 420. The removable adhesive layer 420 may include, for example, a removable adhesive or removable adhesive tap. The removable adhesive includes, for example, an adhesive which can be removed after being heated, irradiated with light, or washed by solvent.

Referring to FIG. 4E, using the temporary substrate 418 as a support, the carrier substrate 400 is thinned from the lower surface 404 to a predetermined thickness to expose a portion of the electronic device 408 and the lower surface 404a. The carrier substrate 400 may be thinned by using, for example, a mechanical grinding or chemical mechanical polish (CMP) process. In one embodiment, a wet cleaning process may be performed to further clean the lower surface 404a.

Figure 4F:
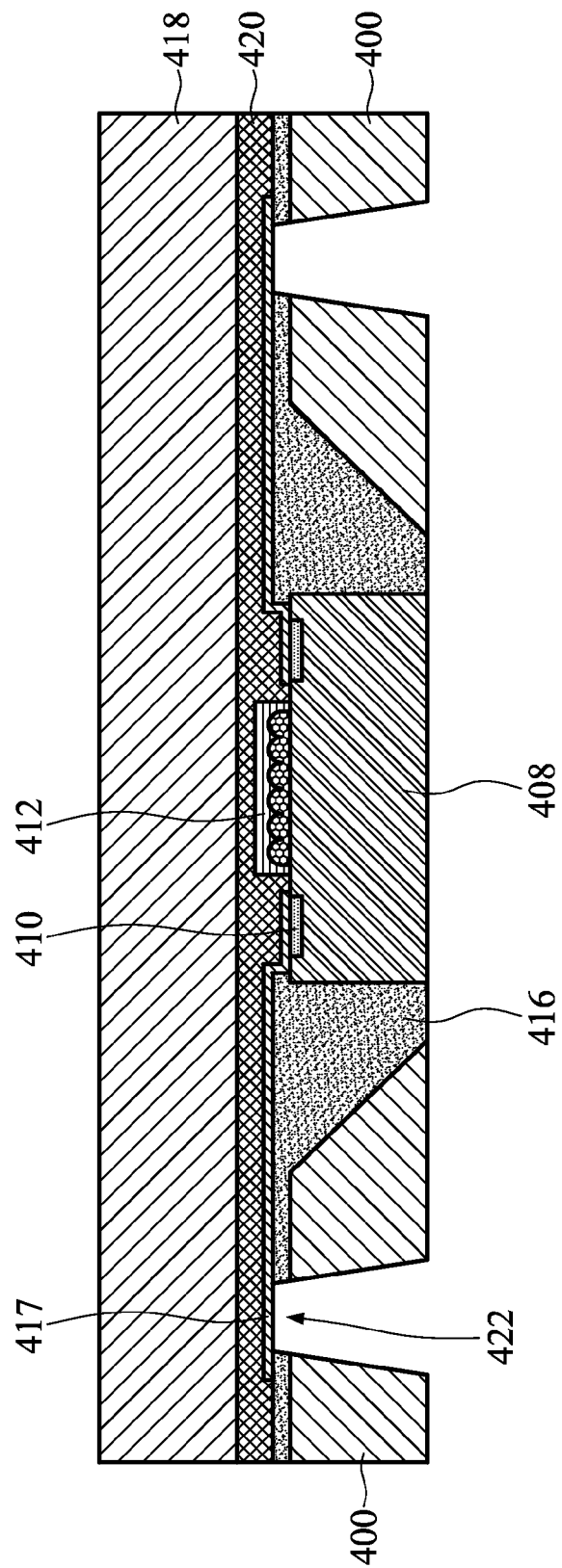

Then, as shown in FIG. 4F, at least a through-hole 422 is formed from the lower surface 404a. The through-hole 422 may be formed by, for example, a photolithography and etching process or a laser drilling process. In one embodiment, the through-hole 422 exposes at least a portion of the redistribution layer 417. In the following process, when a conducting layer is formed overlying a sidewall of the through-hole 422, the formed conducting layer may further electrically connect to the conducting electrode 410 through the redistribution layer 417, forming a conductive bridge between the electronic device 408 and other electrical elements outside of the electronic device package.

Figure 4G:
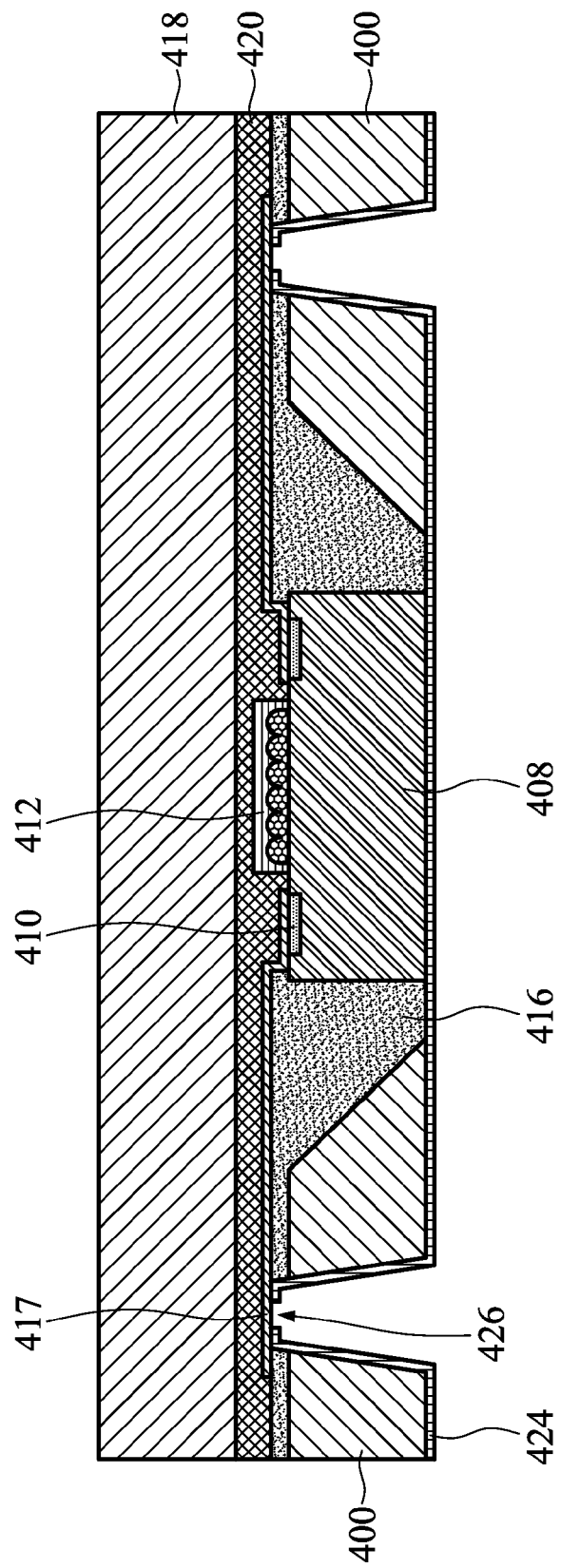

As shown in FIG. 4G, in order to prevent the conducting layer from directly contacting with the electronic device 408, which may cause a short, or prevent the material of the conducting layer from diffusing in the electronic device 408 and influencing its operation, it is preferable to form an insulating layer 424 to overly the sidewall and the bottom portion of the through-hole 422 before forming the conducting layer.

After forming the insulating layer 424, it is preferable to form a first opening 426 in the insulating layer 424 to expose the redistribution layer 417. The first opening 426 may be formed by removing a portion of the insulating layer 424 by an energy beam, such as a laser beam, electron beam, or/and ion beam. In another embodiment, when the insulating layer 424 is a photoresist material, the first opening 426 is directly formed by an exposure and development process.

Figure 4H:
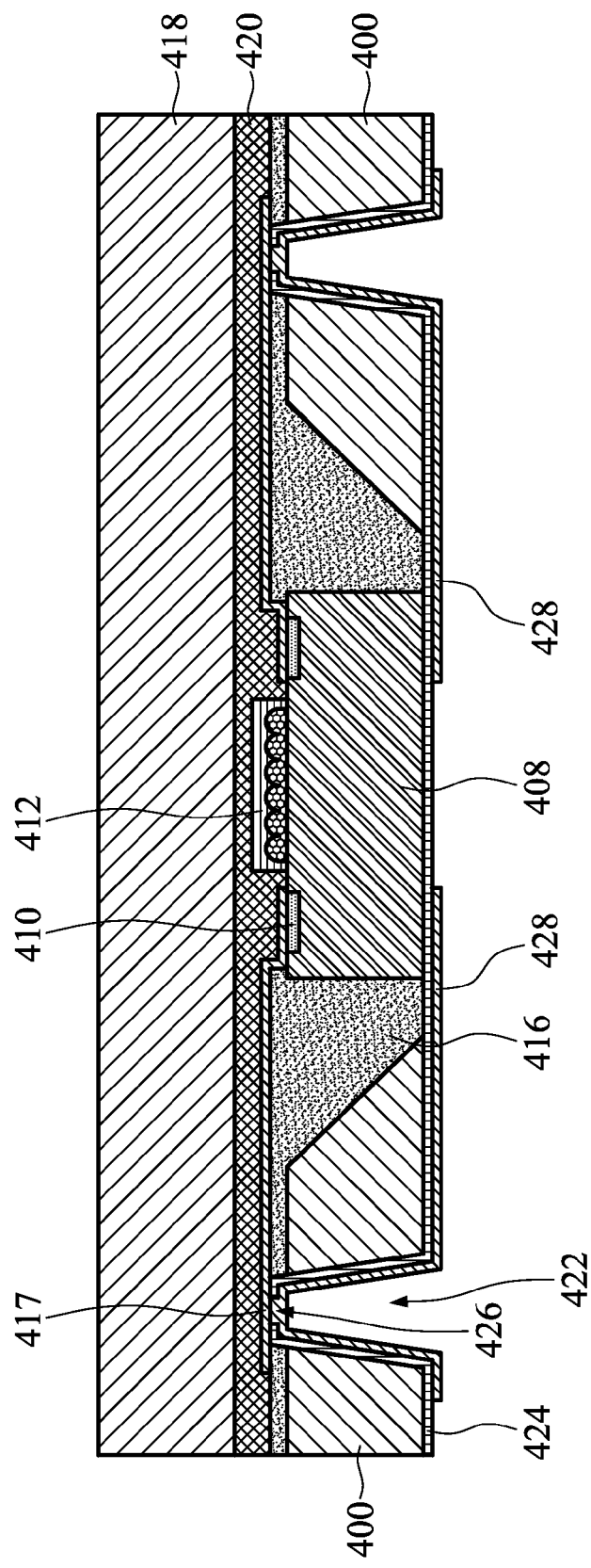

Referring to FIG. 4H, a conducting layer 428 is formed overlying the sidewall of the through-hole 422. The conducting layer 428 electrically connects to the conducting electrode 410 through the redistribution layer 417 and extends overlying the lower surface 404a of the carrier substrate 400. The material of the conducting layer 428 may include metal material, conducting polymer material, conducting ceramic material, or combinations thereof. The conducting layer 428 may be formed by a physical vapor deposition, chemical vapor deposition, or electrochemical plating process.

In one embodiment, the conducting layer 428 electrically connects to the redistribution layer 417 and the conducting electrode 410 through the preformed first opening 426 in the insulating layer 424. Thus, the electronic device in the electronic device 408 may receive or/and send electrical signals through the conducting electrode 410, the redistribution layer 417, and the conducting layer 428. Because the conducting layer 428 extends from the sidewall of the through-hole 422 to the lower surface 404a, the interconnection layout area of the electronic device package is increased, lowering the density of input and output (I/O) in a single plane. In addition, although the illustrated conducting layer 428 is conformally formed overlying the sidewall of the through-hole 422, the conducting layer 428 may substantially fill the through-hole 422 completely in another embodiment. Then, the conducting route may be further extended to overly the lower surface 404a through another redistribution layer.

Figure 4I:
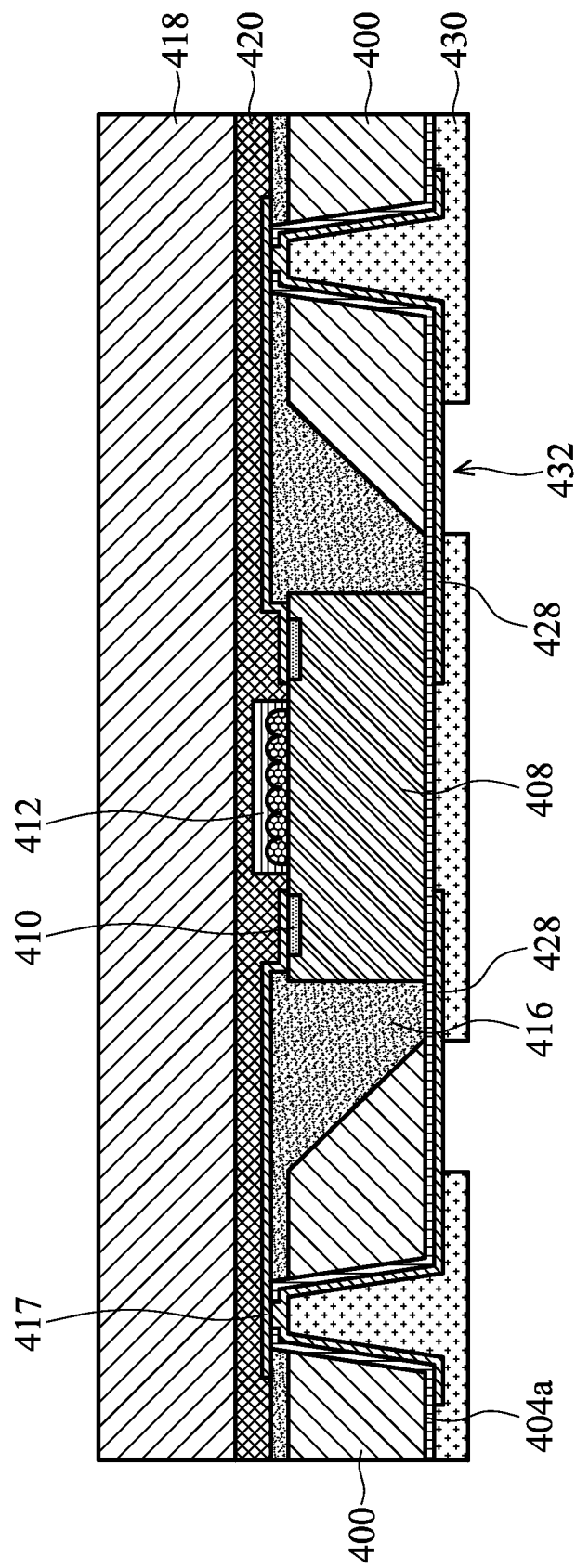
Figure 4J:
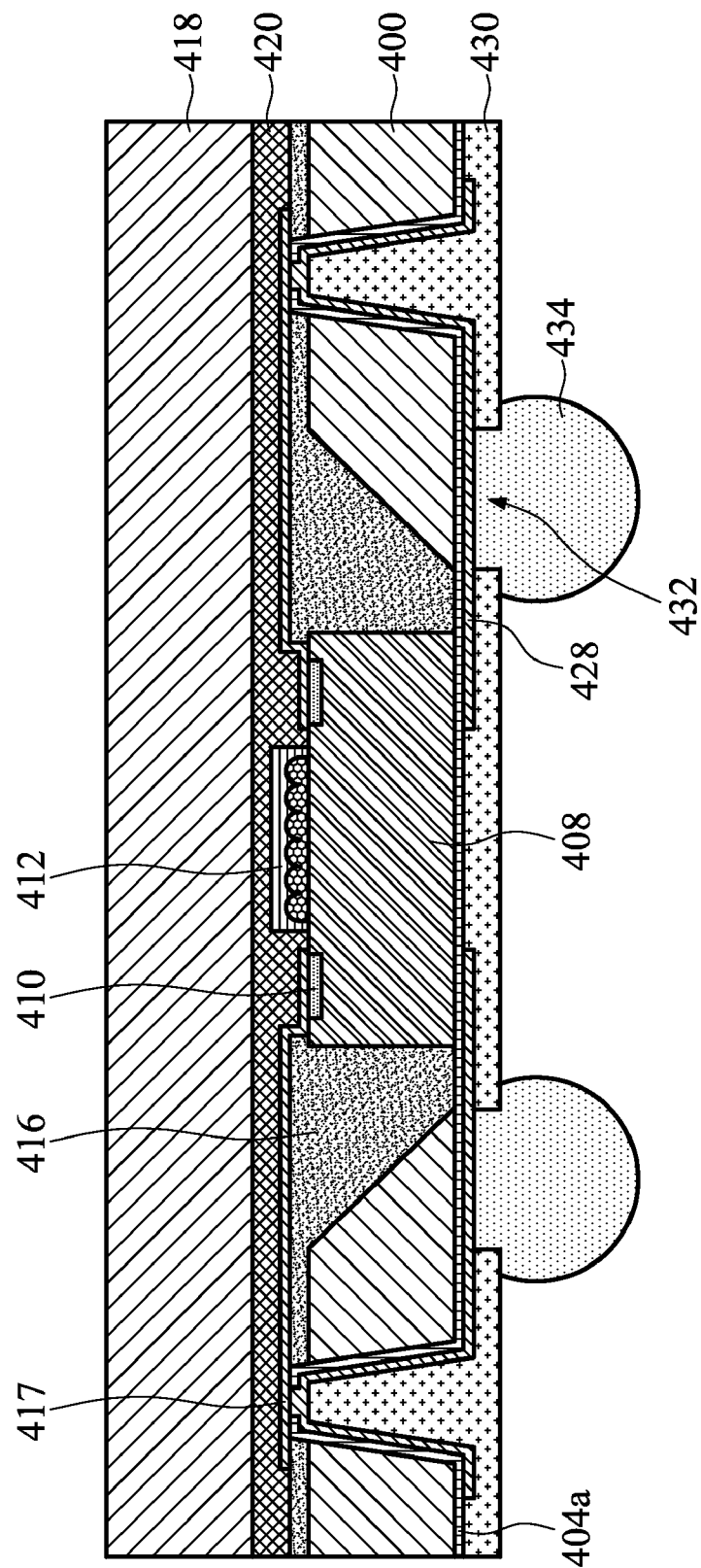

Referring to FIG. 4I, in an embodiment, a passivation layer 430 may be optionally formed overlying the lower surface 404a and the conducting layer 428. The material of the passivation layer may be, for example, a polymer material. The passivation layer 430 may be formed by a spray coating, ink jetting, dipping, chemical vapor deposition, or printing process, or combinations thereof. Then, a portion of the passivation layer 430 is removed to form at least a second opening 432. The passivation layer 430 may be removed by using any conventional method or energy beam. The second opening 432 exposes a portion of the conducting layer 428 to extend and overly the lower surface 404a, thus providing electrical contact region for other electrical elements outside of the electronic device package. For example, in one embodiment as shown in FIG. 4J, a conducting structure 434 is formed in the second opening 432. For example, a bumping process may be performed to form a solder ball (the conducting structure 434) overlying the exposed conducting layer 428. The formed electronic device package can protect the electronic device 408 therein and provide a conducting route to other outside electrical elements.

Figure 4K:
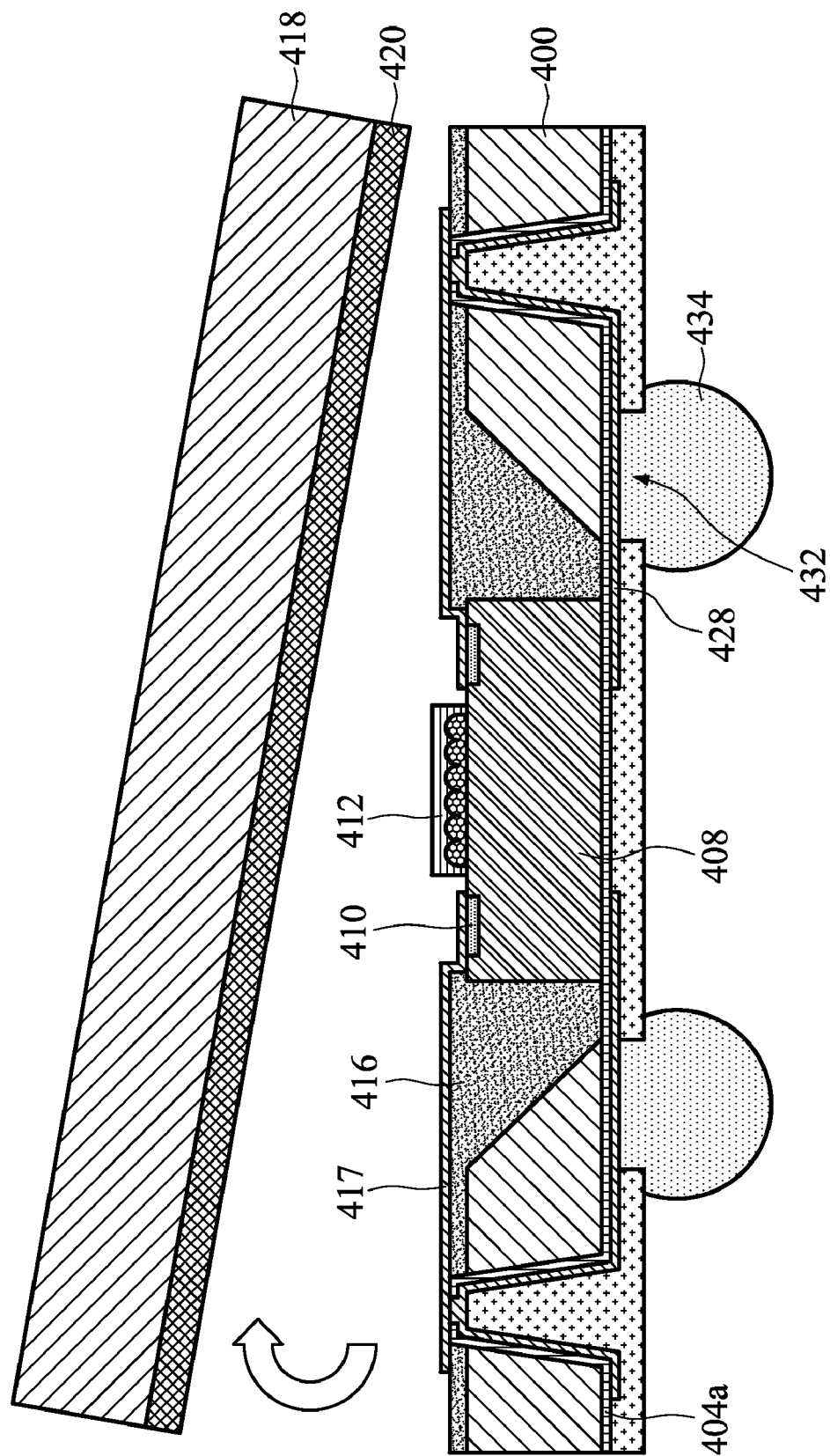

Then, as shown in FIG. 4K, the temporary substrate 418 and the removable adhesive layer 420 are removed from the carrier substrate 400 to obtain an electronic device package in accordance with an embodiment of the present invention. In an embodiment, the carrier substrate 400 is a wafer having a plurality of electronic devices 408 packaged thereon or therein. In the embodiment, a cutting process may further be performed to obtain at least a separate electronic device package. In addition, the cutting process may be performed before or after the step of removing the temporary substrate 418. For example, when the adhesive layer 420 is a removable adhesive tap, it is preferable to cut through the carrier substrate 400 to the adhesive layer 420 along a predetermined scribe line and not cut through the entire adhesive layer 420. Then, the temporary substrate 418 is removed in one step to obtain a plurality of electronic device packages. Thus, the entire temporary substrate 418 may be recycled for reuse. In another embodiment, after the temporary substrate 418 is entirely removed, the carrier substrate 400 is cut to separate a plurality of electronic device packages.

Figure 4L:
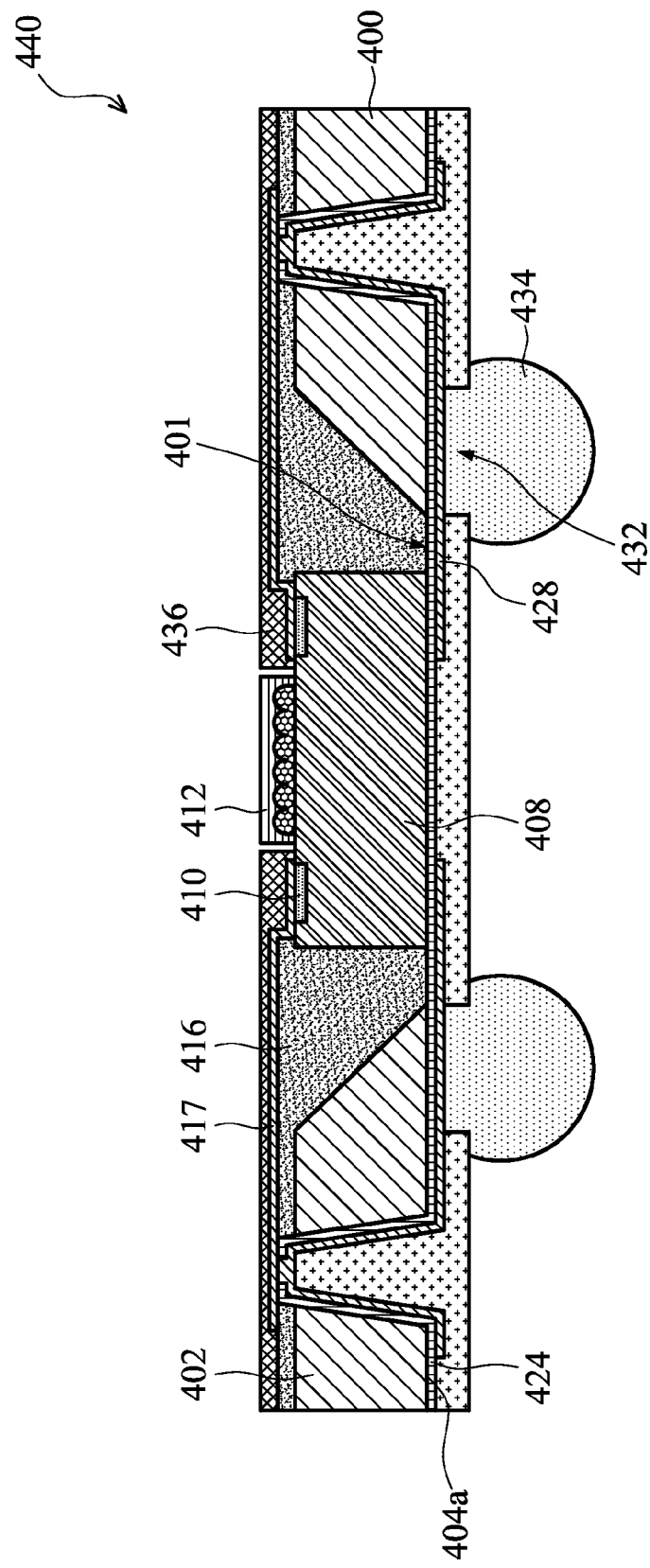

FIG. 4L shows an electronic device package 440 according to an embodiment of the present invention. The electronic device package 440 includes a carrier substrate 400 having at least an opening 401 extending from an upper surface 402 of the carrier substrate 400 toward an opposite lower surface. In the embodiment, the opening 401 penetrates the carrier substrate 400 from the upper surface 402 to an opposite lower surface 404a. The opening 401 is filled with a filling layer 416. An electronic device 408 is disposed in the opening 401 and is surrounded by the filling layer 416. The electronic device 408 has a conducting electrode 410 and is covered by an upper package layer 412. The electronic device package 440 further includes a redistribution layer 417 located on the filling layer 416 and extending overlying the upper surface 402. The redistribution layer 417 electrically connects to the conducting electrode 410. The electronic device package 440 further includes a through-hole 422. A conducting layer 428 is formed overlying a sidewall of the through-hole 422 and further extends to overly the lower surface 404a and electrically connect to the conducting electrode 410 through the redistribution layer 417. As shown in FIG. 4L, the conducting layer 428 provides an electrical route from the conducting electrode 410 of the electronic device 408 to the lower surface 404a of the carrier substrate 400, thus increasing interconnection layout area of the electronic device package and reducing the density of the input and output (I/O) in a single plane. For small sized electronic devices, the method and the structure provided in the embodiments of the invention may further increase layout area, reducing process difficulties for dense layout areas and improving product yield. In addition, an upper passivation layer 436 may further be formed overlying the carrier substrate 400 as shown in FIG. 4L. When the electronic device in the electronic device 408 is a photoelectric device, it is preferable that the upper passivation layer 436 does not cover the transparent upper package layer 412, so that light can successfully travel into or out from the electronic device package.

Figure 5:
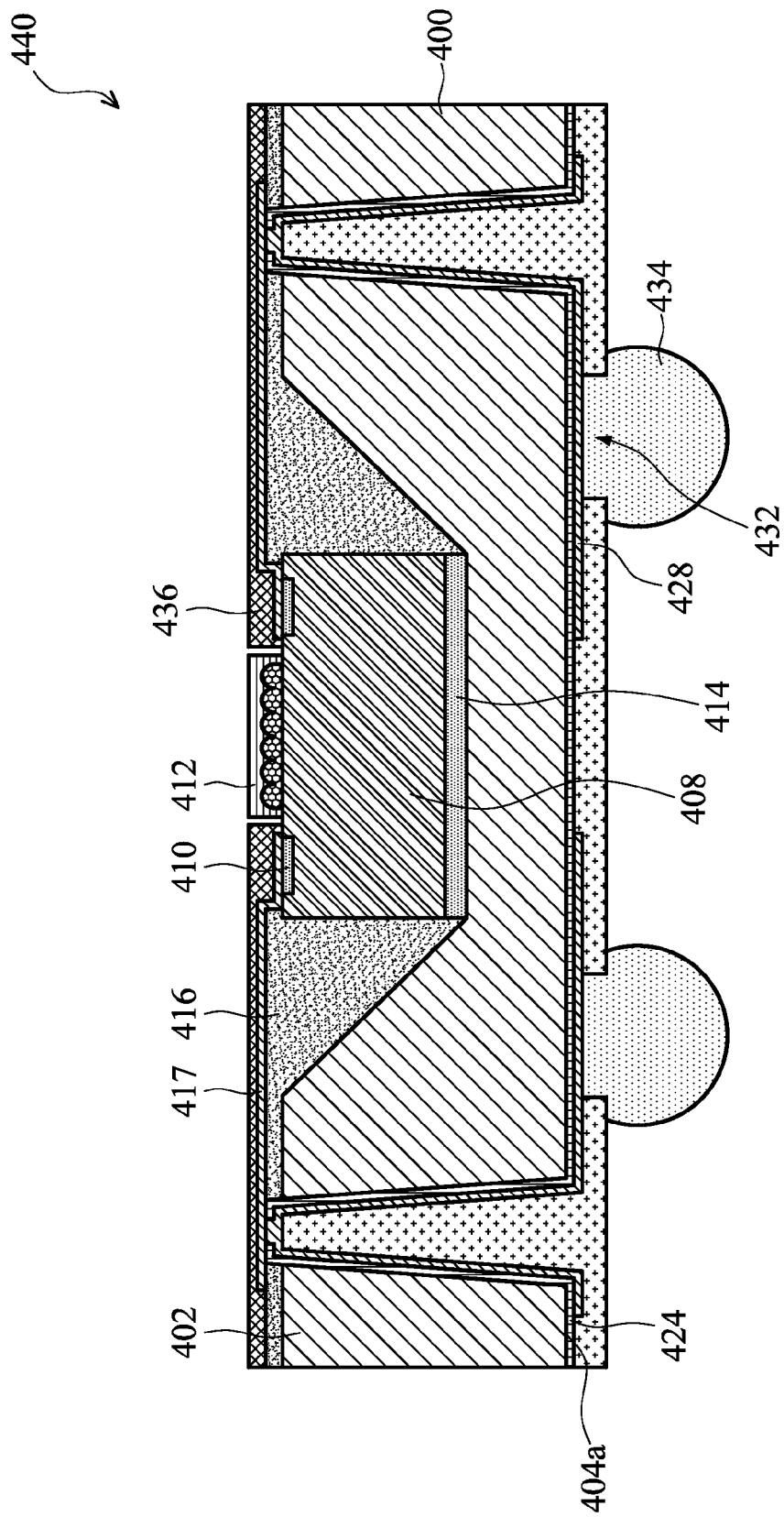
FIG. 5 is a cross-sectional view showing an electronic device package having a through substrate via in accordance with yet another embodiment of the present invention.

For the embodiment having a through-substrate via in the carrier substrate, because there is no through-hole forming process in the electronic device, the probability for damage to the electronic device due to the process is eliminated. Meanwhile, in other embodiments, because the through-hole forming process is only performed in the carrier substrate, the thinning process of the carrier substrate may be omitted or still be performed and not expose a surface of the electronic device 408, such as the structure shown in FIG. 5. Note that for FIG. 5, the same reference numbers as used in FIG. 4 are used to designate the same elements.

Embodiments of the invention have many advantageous features. Because the through substrate via penetrates the electronic device or the carrier substrate, conducting routes can be led to other planes of the electronic device package, thus increasing layout area and decreasing layout density. In another embodiment, by using an upper package layer directly cured from a liquid state as an upper package layer of an electronic device package, the structural strength and the reliability of the electronic device package may be improved. Additionally, for an electronic device package of a photoelectric device, the upper package layer can directly be cured from a liquid state to provide a desired transmittance.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an electronic device package, comprising:
   providing a carrier substrate having an upper surface and an opposite lower surface;
   forming a cavity from the upper surface of the carrier substrate;
   disposing an electronic device having a conducting electrode in the cavity;
   forming a filling layer in the cavity, wherein the filling layer surrounds the electronic device;
   thinning the carrier substrate from the lower surface to a predetermined thickness;
   forming at least a through-hole in the electronic device or in the carrier substrate; and
   forming a conducting layer over a sidewall of the through-hole, wherein the conducting layer electrically connects to the conducting electrode.

2. The method for forming an electronic device package as claimed in claim 1, further comprising thinning the carrier substrate from the lower surface to a predetermined thickness to expose a portion of the electronic device and a lower surface of the carrier substrate.

3. The method for forming an electronic device package as claimed in claim 2, wherein the through-hole is located underlying the conducting electrode of the electronic device.

4. The method for forming an electronic device package as claimed in claim 1, further comprising forming a redistribution layer overlying the filling layer, wherein the redistribution layer electrically connects to the conducting electrode and extends over the upper surface, and wherein the through-hole is located in the carrier substrate and a bottom portion of the through-hole exposes a portion of the redistribution layer.

5. The method for forming an electronic device package as claimed in claim 1, wherein before forming the conducting layer, the method further comprises forming an insulating layer over the sidewall and a bottom portion of the through-hole and forming a first opening in the insulating layer, wherein the first opening exposes the conducting electrode.

6. The method for forming an electronic device package as claimed in claim 1, wherein the carrier substrate is a wafer, and before thinning the carrier substrate from the lower surface, the method further comprises fixing the upper surface of the carrier substrate on a recyclable temporary substrate.

7. The method for forming an electronic device package as claimed in claim 6, wherein the upper surface of the carrier substrate is fixed on the recyclable temporary substrate by a removable adhesive layer, and after the forming of the conducting layer, the method further comprises removing the recyclable temporary substrate, wherein the removing the recyclable temporary substrate comprises:
   cutting through the carrier substrate to the removable adhesive layer along a scribe line; and
   removing the recyclable temporary substrate to obtain a plurality of electronic device packages and recycling the recyclable temporary substrate.

8. The method for forming an electronic device package as claimed in claim 1, further comprising forming an upper package layer by directly curing a liquid state material on the electronic device, there is no adhesive between the upper package layer and the electronic device, and the upper package layer directly cured from the liquid state material has a substantially planar upper surface and a transmittance of more than about 90%.

\* \* \* \* \*